(12) United States Patent
Tan et al.

(10) Patent No.: US 10,991,874 B2
(45) Date of Patent: Apr. 27, 2021

(54) MAGNETO-IONIC DEVICE WITH A SOLID STATE PROTON PUMP AND METHODS FOR USING THE SAME

(71) Applicant: Massachusetts Institute of Technology, Cambridge, MA (US)

(72) Inventors: Aik Jun Tan, Cambridge, MA (US); Geoffrey S. D. Beach, Winchester, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 230 days.

(21) Appl. No.: 16/188,169

(22) Filed: Nov. 12, 2018

(65) Prior Publication Data

US 2019/0172998 A1    Jun. 6, 2019

Related U.S. Application Data

(60) Provisional application No. 62/588,614, filed on Nov. 20, 2017, provisional application No. 62/585,231, filed on Nov. 13, 2017.

(51) Int. Cl.
*H01L 43/02* (2006.01)
*H01F 10/32* (2006.01)
(Continued)

(52) U.S. Cl.
CPC ............... *H01L 43/02* (2013.01); *C25B 1/04* (2013.01); *C25B 9/19* (2021.01); *H01F 10/329* (2013.01);
(Continued)

(58) Field of Classification Search
CPC ..... H01L 43/02; H01L 43/10; H01F 10/3254; H01F 10/3286; H01F 10/329; C25B 1/04
See application file for complete search history.

(56) References Cited

U.S. PATENT DOCUMENTS 9,799,825 B2    10/2017    Bauer et al.
2006/0240992 A1    10/2006    Brandt et al.
(Continued)

OTHER PUBLICATIONS

Manthiram et al., "Characterization of oxygen-deficient perovskites as oxide-ion electrolytes," Solid State Ionics 62 (1993) 225-234. (Year: 1993).*
(Continued)

*Primary Examiner* — Nicholas A Smith
(74) *Attorney, Agent, or Firm* — Smith Baluch LLP

(57) ABSTRACT

A spintronic device controls both the electrical charge and the spin of electrons to transmit, process, and store information. The control of electron spin provides additional degrees of freedom to modify the electric and magnetic properties of materials such as magnetic anisotropy. However, the development and integration of spintronic devices has been limited, in part, by the lack of a robust approach to electrically gate magnetism. Conventional approaches to gating magnetism either exhibit impractically small changes to the properties of a magnet or limited operating lifetime due to material degradation. Here, a magneto-ionic device operates using a hydrogen-gated magneto-ionic mechanism to overcome these shortcomings. A gate voltage applied to the magneto-ionic device causes protons to move towards a magnetic layer where the protons reduce to hydrogen. The presence of hydrogen and protons leads to large changes in the magnetic layer without degradation. This voltage-induced process is reversible.

28 Claims, 29 Drawing Sheets

(51) Int. Cl.
  C25B 9/08      (2006.01)
  H01L 43/10     (2006.01)
  C25B 1/04      (2006.01)
  H01L 27/22     (2006.01)
  H01F 41/30     (2006.01)
  C25B 9/19      (2021.01)

(52) U.S. Cl.
  CPC ..... *H01F 10/3254* (2013.01); *H01F 10/3286* (2013.01); *H01F 41/303* (2013.01); *H01L 27/22* (2013.01); *H01L 43/10* (2013.01)

(56) References Cited

U.S. PATENT DOCUMENTS

2016/0268029 A1  9/2016 Wang et al.
2017/0084824 A1  3/2017 Bauer et al.

OTHER PUBLICATIONS

International Search Report and Written Opinion in International Patent Application No. PCT/US18/60566 dated Jan. 24, 2019, 13 pages.
Kang et al., Complementary Skyrmion Racetrack Memory with Voltage Manipulation. IEEE Electron Device Letters, vol. 37(7) Jul. 2016. 3 pages.
Kang et al., Skyrmion-Electronics: An Overview and Outlook. Proceedings of the IEEE, vol. 104(10), Oct. 2016. 22 pages.
Wang et al., Controllable transport of a skyrmion in a ferromagnetic narrow channel with voltage-controlled magnetic anisotropy. Journal of Physics D: Applied Physics 51, 205002 (2018). 10 pages.
Rodriguez et al., "Water Gas Shift Reaction on Cu and Au Nanoparticles Supported on CeO2 (111) and ZnO (0001): Intrinsic Activity and Importance of Support Interactions." Angewandte Chemie International Edition 46.8 (2007): 1329-1332.
Rossmeisl et al., "Electrolysis of water on (oxidized) metal surfaces." Chemical Physics 319.1-3 (2005): 178-184.
Rossmeisl et al., "Electrolysis of water on oxide surfaces." Journal of Electroanalytical Chemistry 607.1-2 (2007): 83-89.
Ryu et al., "Chiral spin torque at magnetic domain walls." Nature Nanotechnology 8.7 (2013): 527-533.
Shimamura et al., "Electrical control of Curie temperature in cobalt using an ionic liquid film." Applied Physics Letters 100.12 (2012): 122402. 4 pages.
Shiota et al., "Voltage-assisted magnetization switching in ultrathin Fe80Co20 alloy layers." Applied Physics Express 2.6 (2009): 063001. 4 pages.
Strukov et al., "Exponential ionic drift: fast switching and low volatility of a thin-film memristors." Applied Physics A 94.3 (2009): 515-519.
Torrejon et al., "Interface control of the magnetic chirality in CoFeB/MgO heterostructures with heavy-metal underlayers." Nature Communications 5.1 (2014): 1-8.
Tsujikawa et al., "Finite electric field effects in the large perpendicular magnetic anisotropy surface Pt/Fe/Pt (001): A first-principles study." Physical Review Letters 102.24 (2009): 247203. 4 pages.
Tsuruoka et al., "Humidity effects on the redox reactions and ionic transport in a Cu/Ta2O5/Pt atomic switch structure." Japanese Journal of Applied Physics 55.6S1 (2016): 06GJ09. 6 pages.
Tymoczko et al., "Making the hydrogen evolution reaction in polymer electrolyte membrane electrolysers even faster." Nature Communications 7.1 (2016): 1-6.
Jrazhdin et al., "Nanomagnonic devices based on the spin-transfer torque." Nature Nanotechnology 9.7 (2014): 609-513.
Valov et al., "Nanobatteries in redox-based resistive switches require extension of memristor theory." Nature Communications 4.1 (2013): 1-9.
Valov et al., "Nanoscale electrochemistry using dielectric thin films as solid electrolytes." Nanoscale 8.29 (2016): 13828-13837.
Verba et al., "Excitation of propagating spin waves in ferromagnetic nanowires by microwave voltage-controlled magnetic anisotropy." Scientific Reports 6.1 (2016): 1-9.
Vogt et al., "Realization of a spin-wave multiplexer." Nature Communications 5.1 (2014): 1-5.
Waser et al., "Nanoionics-based resistive switching memories." Nanoscience And Technology: A Collection of Reviews from Nature Journals. 2010. 158-165.
Waser et al., "Redox-based resistive switching memories—nanoionic mechanisms, prospects, and challenges." Advanced Materials 21.25-26 (2009): 2632-2663.
Woo et al., "Observation of room-temperature magnetic skyrmions and their current-driven dynamics in ultrathin metallic ferromagnets." Nature Materials 15.5 (2016): 501-506.
Yakushiji et al., "Ultrathin Co/Pt and Co/Pd superlattice films for MgO-based perpendicular magnetic tunnel functions." Applied Physics Letters 97.23 (2010): 232508. 4 pages.
Yang et al., "Memristive switching mechanism for metal/oxide/metal nanodevices." Nature Nanotechnology 3.7 (2008): 429-433.
Yang et al., "Memristive devices for computing." Nature Nanotechnology 8.1 (2013): 13-24.
Zhernenkov et al., "Electric-field modification of magnetism in a thin CoPd film." Physical Review B 82.2 (2010): 024420. 6 pages.
Albisetti et al., "Nanopatterning reconfigurable magnetic landscapes via thermally assisted scanning probe lithography." Nature Nanotechnology 11.6 (2016): 545-551.
Baldrati et al., "Magneto-ionic effect in CoFeB thin films with in-plane and perpendicular-to-plane magnetic anisotropy." Applied Physics Letters 110.1 (2017): 012404. 6 pages.
Bauer et al., "Electric field control of domain wall propagation in Pt/Co/GdOx films." Applied Physics Letters 100.19 (2012): 192408. 5 pp.
Bauer et al., "Magnetoelectric charge trap memory." Nano Letters 12.3 (2012): 1437-1442.
Bauer et al., "Magneto-ionic control of interfacial magnetism." Nature Materials 14.2 (2015): 174-181.
Bauer et al., "Voltage-controlled domain wall traps in ferromagnetic nanowires." Nature Nanotechnology 8.6 (2013): 411-416.
Bl et al., "Electrical control of metallic heavy-metal—Ferromagnet Interfacial States." Physical Review Applied 8.3 (2017): 034003. 9 pages.
Bl et al., "Metal Based Nonvolatile Field-Effect Transistors." Advanced Functional Materials 26.20 (2016): 3490-3495.
Bl et al., "Reversible control of Co magnetism by voltage-induced oxidation." Physical Review Letters 113.26 (2014): 267202. 5 pages.
Bode et al., "Chiral magnetic order at surfaces driven by inversion asymmetry." Nature 447.7141 (2007): 190-193.
Brächer et al., "Excitation and detection of short-waved spin waves in ultrathin Ta/CoFeB/MgO-layer system suitable for spin-orbit-torque magnonics." arXiv preprint arXiv:1701.01399 (2017). 6 pages.
Chumak et al., "Magnon transistor for all-magnon data processing." Nature Communications 5.1 (2014): 1-8.
Conte et al., "Role of B diffusion in the interfacial Dzyaloshinskii-Moriya interaction in Ta/Co 20 F e 60 B 20/MgO nanowires." Physical Review B 91.1 (2015): 014433. 9 pages.
Crawford et al., "Impact of different electrolytes on photocatalytic water splitting." Journal of the Electrochemical Society 156.5 (2009): H346. 7 pages.
Demasius et al., "Enhanced spin—orbit torques by oxygen incorporation in tungsten films." Nature Communications 7.1 (2016): 1-7.
Di et al., "Direct observation of the Dzyaloshinskii-Moriya interaction in a Pt/Co/Ni film." Physical Review Letters 114.4 (2015): 047201. 5 pages.
Duan et al., "Surface magnetoelectric effect in ferromagnetic metal films." Physical Review Letters 101.13 (2008): 137201. 4 pages.
Duan et al., "Universality of the surface magnetoelectric effect in half-metals." Physical Review B 79.14 (2009): 140403. 4 pages.
Dzyaloshinsky,. "A thermodynamic theory of "weak" ferromagnetism of antiferromagnetics." Journal of Physics and Chemistry of Solids 4.4 (1958): 241-255.

(56) References Cited

OTHER PUBLICATIONS

Editorial, The next wave, Nature Physics, 11(6), 437 (2015). 1 page.
Emori et al., "Current-driven dynamics of chiral ferromagnetic domain walls." Nature Materials 12.7 (2013): 611-616.
Emori et al., "Large voltage-induced modification of spin-orbit torques in Pt/Co/GdOx" Applied Physics Letters 105.22 (2014): 222401. 5 pages.
Emori et al., "Spin Hall torque magnetometry of Dzyaloshinskii domain walls." Physical Review B 90.18 (2014):184427. 13 pages.
Fabbri et al., "Developments and perspectives of oxide-based catalysts for the oxygen evolution reaction." Catalysis Science & Technology 4.11 (2014): 3800-3821.
Fert et al., "Role of anisotropic exchange interactions in determining the properties of spin-glasses." Physical Review Letters 44.23 (1980): 1538-1541.
Gambardella et al., "Current-induced spin-orbit torques." Philosophical Transactions of the Royal Society A: Mathematical, Physical and Engineering Sciences 369.1948 (2011): 3175-3197.
Garello et al., "Symmetry and magnitude of spin-orbit torques in ferromagnetic heterostructures." Nature Nanotechnology 8.8 (2013): 587-593.
Gilbert et al., "Controllable positive exchange bias via redox-driven oxygen migration." Nature Communications 7.1 (2016): 1-8.
Gilbert et al., "Structural and magnetic depth profiles of magneto-ionic heterostructures beyond the interface limit." Nature Communications 7 (2016): 12264. 8 pages.
Grünberg et al., "Layered magnetic structures: Evidence for antiferromagnetic coupling of Fe layers across Cr interlayers." Physical Review Letters 57.19 (1986): 2442-2445.
Grutter et al., "Reversible control of magnetism in La0.67Sr0.33MnO3 through chemically-induced oxygen migration." Applied Physics Letters 108.8 (2016): 082405. 6 pages.
Ha et al., "Voltage induced magnetic anisotropy change in ultrathin Fe 80 Co 20/MgO junctions with Brillouin light scattering." Applied Physics Letters 96.14 (2010): 142512. 4 pages.
Heide et al., "Dzyaloshinskii-Moriya interaction accounting for the orientation of magnetic domains in ultrathin films: Fe/W (110)." Physical Review B 78.14 (2008): 140403. 4 pages.
Hoffmann,. "Spin Hall effects in metals." IEEE Transactions on Magnetics 49.10 (2013): 5172-5193.
Ikeda et al.,"A perpendicular-anisotropy CoFeB—MgO magnetic tunnel junction." Nature Materials 9.9 (2010): 721-724.
Kreuer, "Proton conductivity: materials and applications." Chemistry of Materials 8.3 (1996): 610-641.
Lavrijsen et al., "Magnetic ratchet for three-dimensional spintronic memory and logic." Nature 493.7434 (2013): 347-650.
Liu et al., "Current-induced switching of perpendicularly magnetized magnetic layers using spin torque from the spin Hall effect." Physical Review Letters 109.9 (2012): 096602. 5 pages.
Liu et al., "Spin-torque switching with the giant spin Hall effect of tantalum." Science 336.6081 (2012): 555-558.
Manchon et al., "Analysis of oxygen induced anisotropy crossover in Pt/Co/M Ox trilayers." Journal of Applied Physics 104.4 (2008): 043914. 8 pages.
Manchon et al., "X-ray analysis of the magnetic influence of oxygen in Pt/Co/Al O x trilayers." Journal of Applied Physics 103.7 (2008): 07A912. 4 pages.
Maruyama et al., "Large voltage-induced magnetic anisotropy change in a few atomic layers of iron." Nature Nanotechnology 4.3 (2009): 158-161.
Moriya, "Anisotropic superexchange interaction and weak ferromagnetism." Physical Review 120.1 (1960): 91. 8 pages.
Newhouse-Illige et al., "Voltage-controlled interlayer coupling in perpendicularly magnetized magnetic tunnel functions." Nature Communications 8.1 (2017): 1-7.
Nguyen et al., "Enhanced spin Hall torque efficiency in Pt100-x Al x and Pt100-x Hf x alloys arising from the intrinsic spin Hall effect." Applied Physics Letters 108.24 (2016): 242407. 5 pages.
Nguyen et al., "Spin torque study of the spin Hall conductivity and spin diffusion length in platinum thin films with varying resistivity." Physical Review Letters 116.12 (2016): 126601. 6 pages.
Niranjan et al., "Electric field effect on magnetization at the Fe/MgO (001) interface." Applied Physics Letters 96.22 (2010): 222504. 4 pages.
Norby et al., "Hydrogen in oxides." Dalton Transactions 19 (2004): 3012-3018.
Onofrio et al., "Atomic origin of ultrafast resistance switching in nanoscale electrometallization cells." Nature Materials 14.4 (2015): 440-446.
Parkin et al., "Oscillations in exchange coupling and magnetoresistance in metallic superlattice structures: Co/Ru, Co/Cr, and Fe/Cr." Physical Review Letters 64.19 (1990): 2304. 5 pages.

* cited by examiner

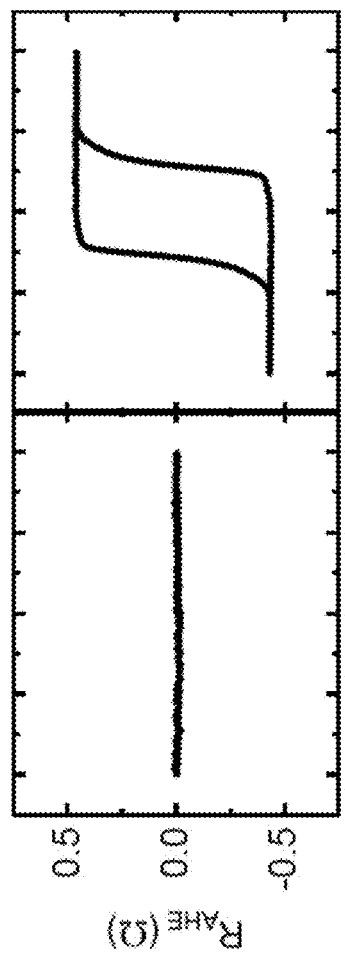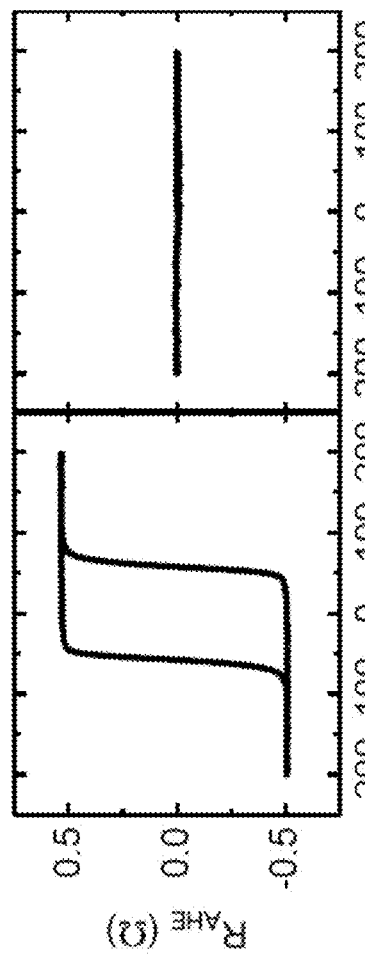

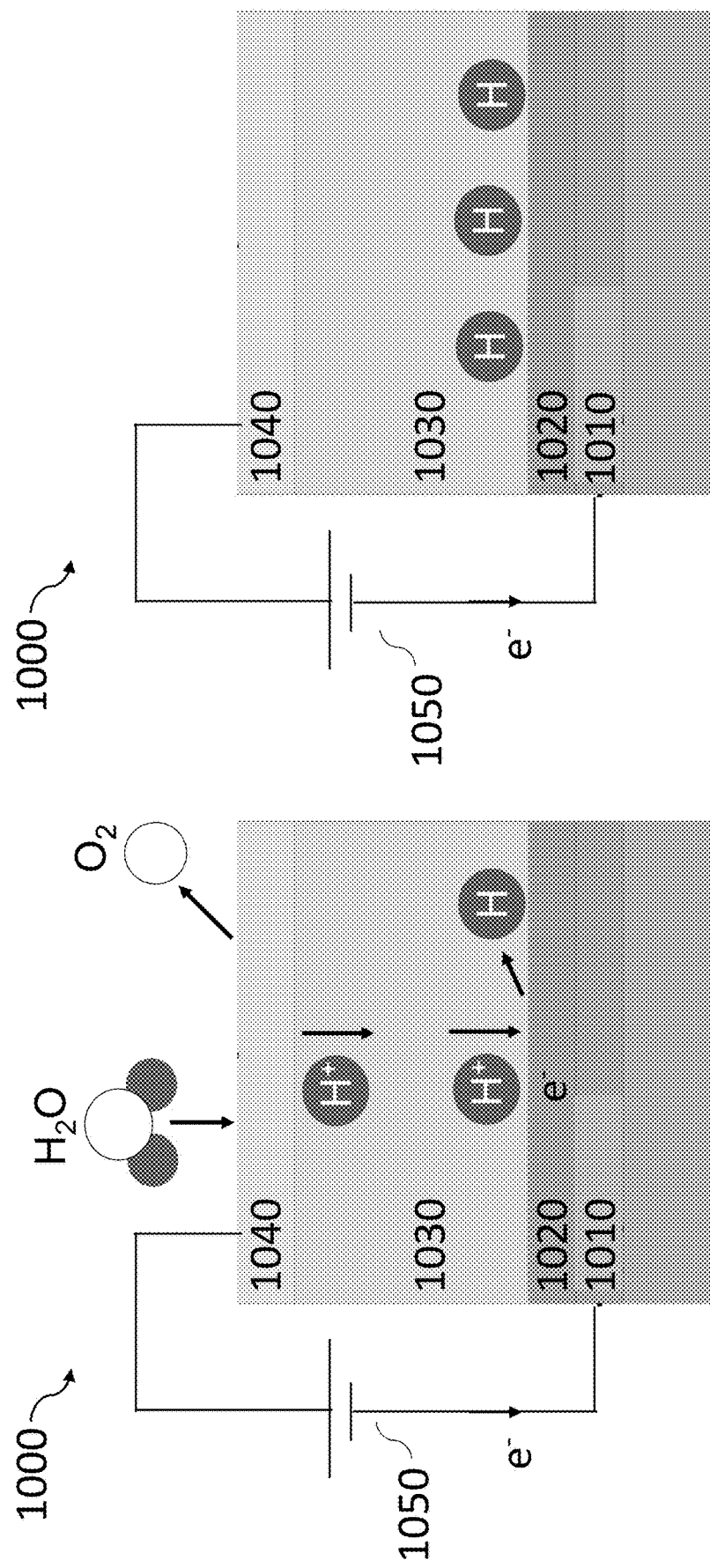

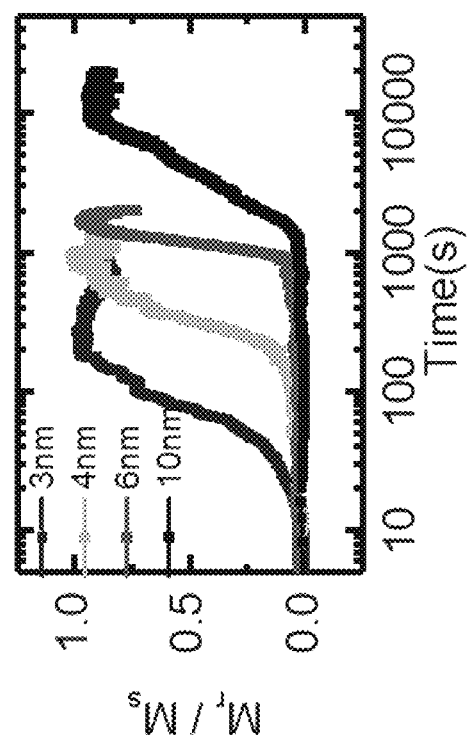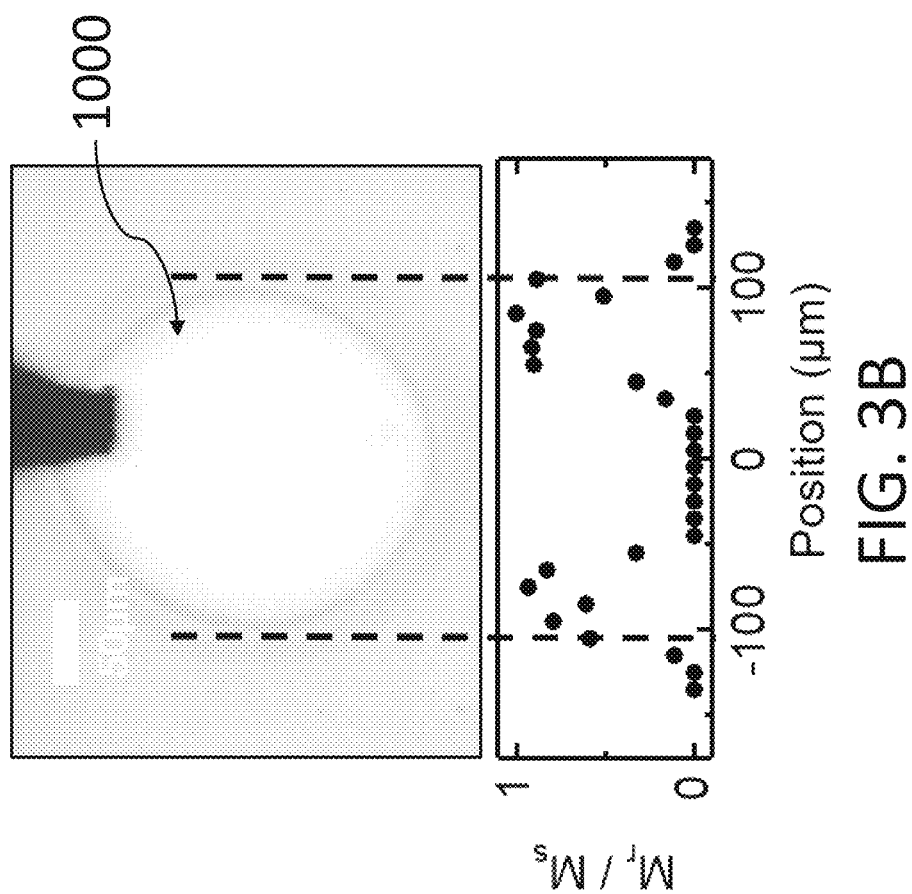
FIG. 3A
FIG. 3B

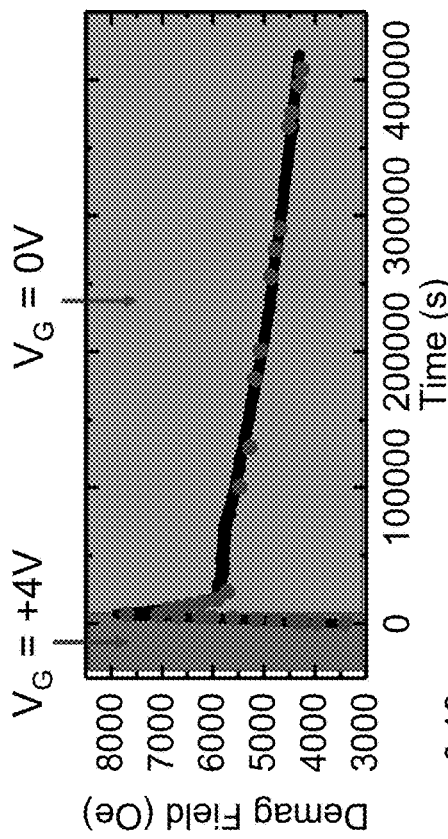
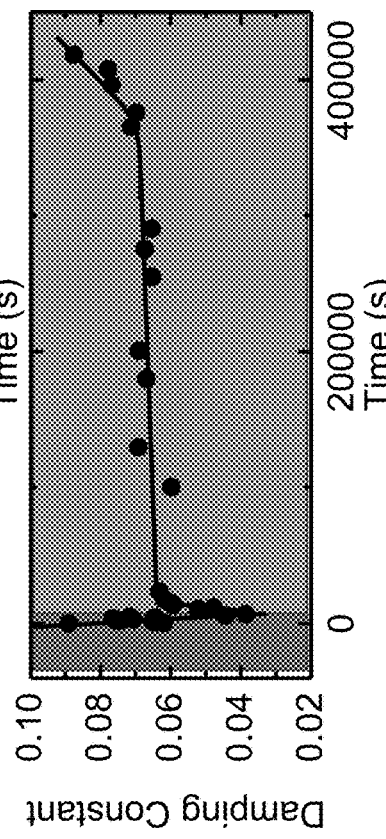
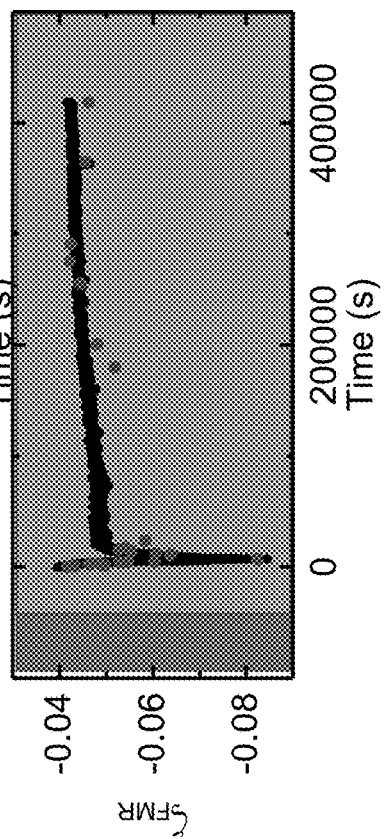
FIG. 5A
FIG. 5B
FIG. 5C

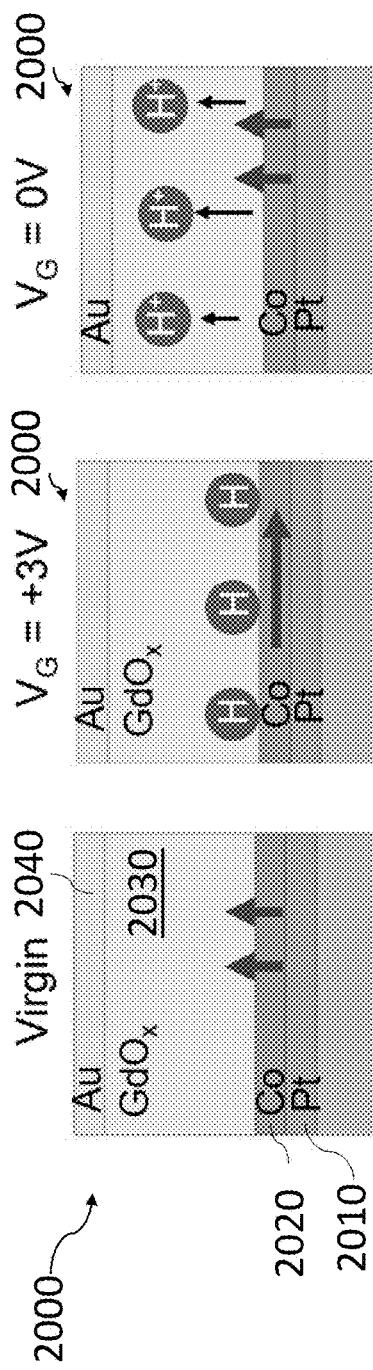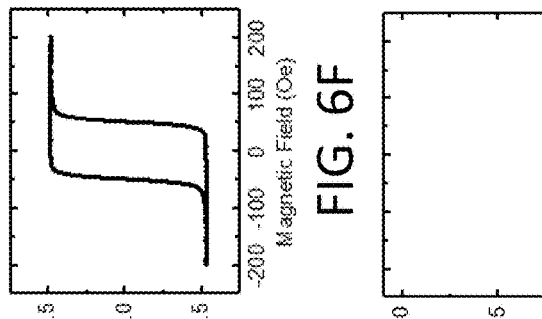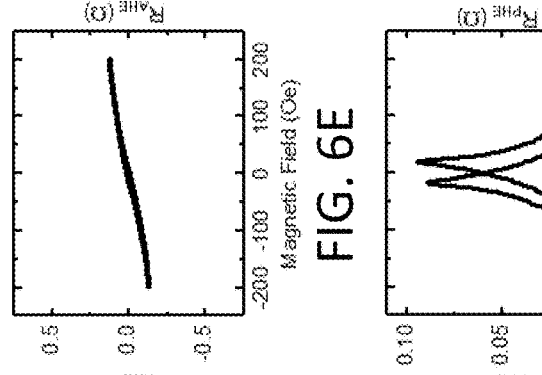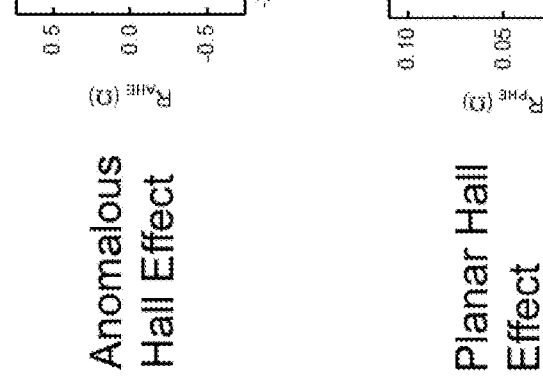
Anomalous Hall Effect
Planar Hall Effect

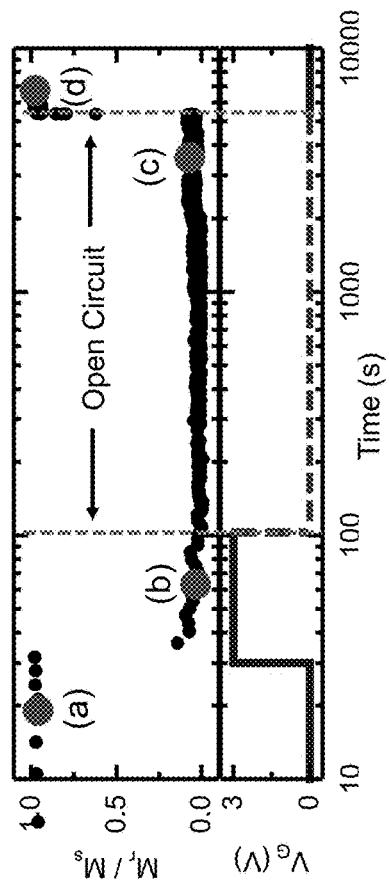
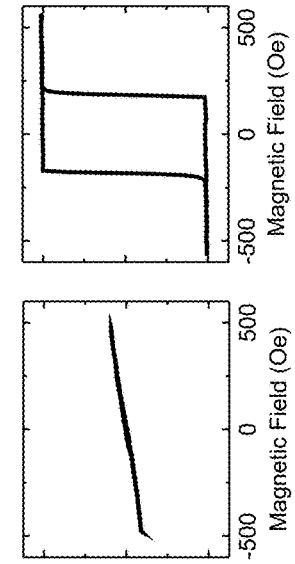
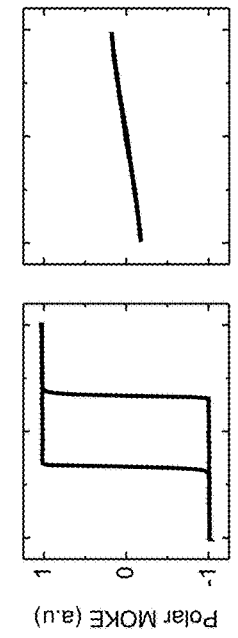
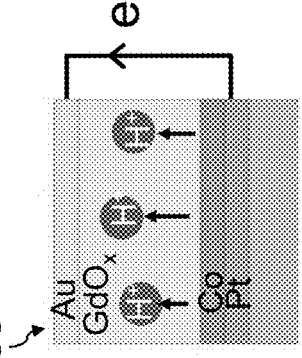
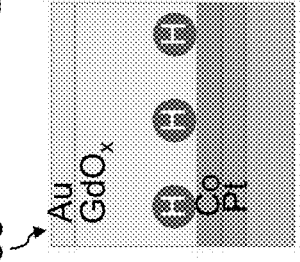
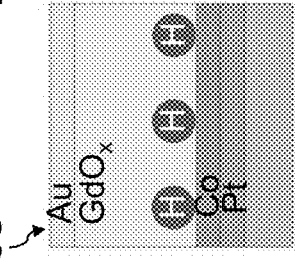
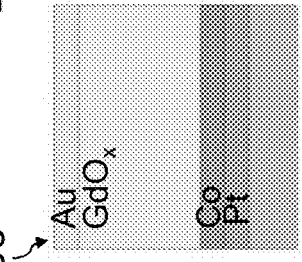

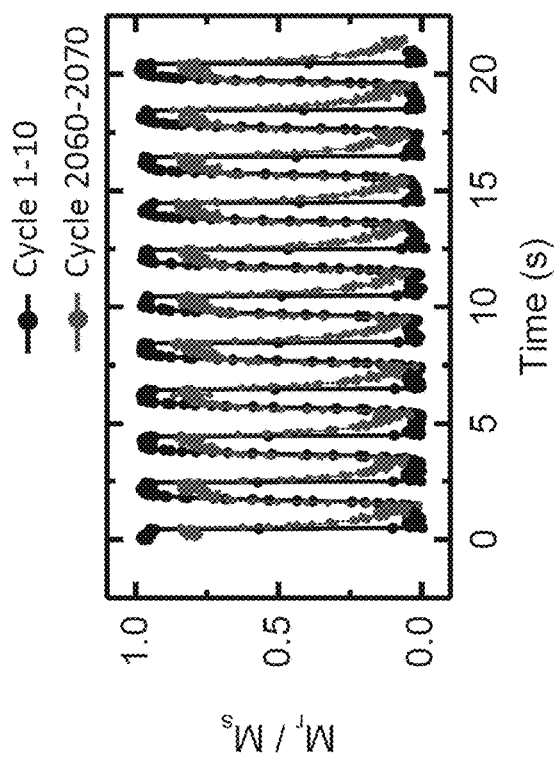
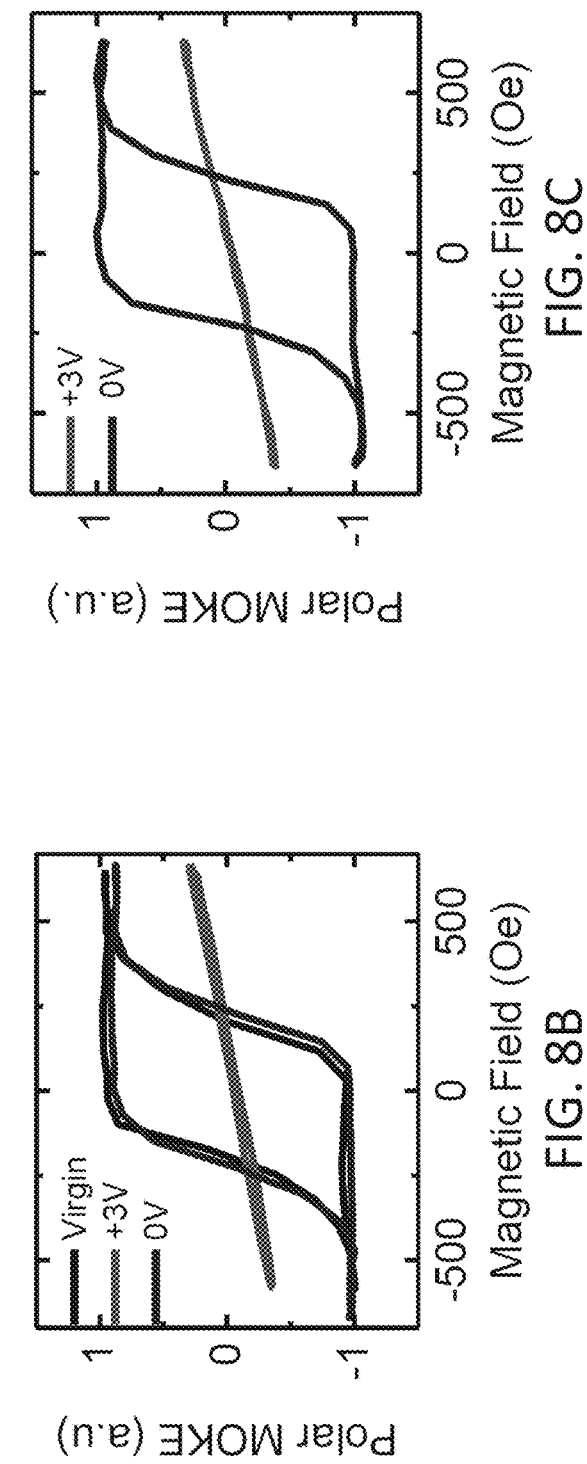
FIG. 8A
FIG. 8B
FIG. 8C ively, the magneto-ionic device can include another magnetic layer, disposed between the first magnetic layer and the proton conductor, to reduce degradation of the first magnetic layer and a coupling spacer disposed between the first magnetic layer and the second magnetic layer.

MAGNETO-IONIC DEVICE WITH A SOLID STATE PROTON PUMP AND METHODS FOR USING THE SAME

CROSS-REFERENCE TO RELATED PATENT APPLICATION(S)

This application claims priority, under 35 U.S.C. § 119(e), to U.S. Application No. 62/585,231, filed on Nov. 13, 2017, entitled "MAGNETOIONIC CONTROL OF SPINTRONIC DEVICE USING A SOLID STATE PROTON PUMP" and to U.S. Application No. 62/588,614, filed on Nov. 20, 2017, entitled "MAGNETOIONIC CONTROL OF SPINTRONIC DEVICE USING A SOLID STATE PROTON PUMP", and each of the aforementioned applications are incorporated herein by reference in its entirety.

GOVERNMENT SUPPORT

This invention was made with Government support under Grant No. DMR1419807 awarded by the National Science Foundation (NSF). The Government has certain rights in the invention.

BACKGROUND

A spintronic device operates, in part, by controlling the spin of electrons to transmit, process, and store information. Compared to conventional electronic devices, which operate by manipulating only the electrical charge of electrons, spintronic devices may control both the electrical charge and the spin of electrons, thus providing additional degrees of freedom to modify the electric and magnetic properties of materials. Exemplary material properties that may be modified by controlling both the electrical charge and spin of electrons include, but are not limited to, the electrical resistance, magnetic anisotropy, magnetic damping, spin-orbit torque efficiency, and exchange interactions, such as the Dzyaloshinskii-Moriya interaction (DMI) and the Ruderman-Kittel-Kasuya-Yosida (RKKY) interaction.

Additionally, the manipulation of the electron spin in spintronic devices can provide several advantages over conventional electronic devices, such as lower power consumption, less heat dissipation, non-volatility for memory devices, and faster switching times. Furthermore, spintronic devices may be fabricated using a broader range of materials, including common metals such as iron, aluminum, and copper. In contrast, conventional electrical devices typically require specialized semiconductor materials.

SUMMARY

Embodiments described herein are directed to a magneto-ionic device that operates using a hydrogen-gated magneto-ionic mechanism. A positive gate voltage is applied to the magneto-ionic device to induce proton motion towards a magnetic layer where the protons then reduce to hydrogen via a hydrogen evolution reaction. The presence of hydrogen proximate to the magnetic layer causes the magnetic layer to transition between at least two magnetic states. The magnetic states may correspond to a magnetic property of the magnetic layer, such as magnetic anisotropy, magnetic damping, spin-orbit torque efficiency, and exchange interactions, such as DMI and the RKKY interaction. When the positive gate voltage is removed or a negative gate voltage is applied, the reverse process occurs where the hydrogen splits into protons and electrons and the protons are removed from the magneto-ionic device. The hydrogen-gated magneto-ionic mechanism can induce a change in magnetic anisotropy substantially greater than previous magnetoelectric-based approaches while substantially reducing chemical and structural degradation compared to previous redox-based magneto-ionic approaches.

In one example, a magneto-ionic device is comprised of a first electrode, a second electrode, a magnetic layer disposed between the first electrode and the second electrode, and a proton conductor disposed between the magnetic layer and the second electrode. A first gate voltage is applied to the first electrode and the second electrode to transport protons from the second electrode through the proton conductor toward the magnetic layer where a portion of the protons are reduced to hydrogen. The hydrogen and the remaining portion of the protons thus cause the magnetic layer to switch from a first magnetic state to a second magnetic state. The first and second electrodes can be made of gold, silver, copper, platinum, palladium, iridium, rhenium, ruthenium, rhodium, indium, tin, bismuth, antimony, 3d transition metal, or an alloy thereof. The first and second magnetic states can each be a magnetic property of the magnetic layer comprising at least one of magnetic anisotropy, magnetic damping, spin-orbit torque, or exchange interaction.

This magneto-ionic device can also include a third electrode coplanar with and electrically isolated from the second electrode, e.g., as part of any electrode array. It can also include another magnetic layer disposed between the first electrode and the first magnetic layer and a tunnel barrier, disposed between the first magnetic layer and the second magnetic layer, to tunnel electrons between the first magnetic layer and the second magnetic layer. In this case, this other magnetic layer can remain in a third magnetization state while the first magnetic layer switches from the first magnetic state to the second magnetic state and/or the first magnetic layer can transition from the second magnetic state to the third magnetic state in response to injection of a spin-polarized current into the first magnetic layer. Alternatively, the magneto-ionic device can include another magnetic layer, disposed between the first magnetic layer and the proton conductor, to reduce degradation of the first magnetic layer and a coupling spacer disposed between the first magnetic layer and the second magnetic layer.

In another example, a method of reversibly switching a magnetic state of a magneto-ionic device that includes a first electrode, a magnetic layer, a proton conductor, and a second electrode, is comprised of the following steps: (1) applying a first gate voltage to the first electrode and the second electrode from a voltage source. The first gate voltage transports protons through the proton conductor from the second electrode toward the magnetic layer where a portion of the protons are reduced to hydrogen. The hydrogen and the remaining portion of the protons cause the magnetic layer to switch from a first magnetic state to a second magnetic state.

In some instances, the magneto-ionic device may include a hydrogen storage layer disposed between the proton conductor and the second electrode. The hydrogen storage layer may store water or hydrogen, which can be oxidized to protons when a positive gate voltage is applied to the second electrode. The protons may then be used in a hydrogen evolution reaction causing the magnetic layer to switch between magnetic states. In this manner, the magneto-ionic device may be a closed system. In some instances, a hydrogen insertion layer may also be disposed between the magnetic layer and the proton conductor. The hydrogen insertion layer may be used to store or release hydrogen when a gate voltage is applied to the magneto-ionic device. The inclusion of the hydrogen insertion layer can prevent oxidation of the magnetic layer when a negative gate voltage is applied to the magneto-ionic device, thus enabling faster switching speeds when removing hydrogen from the magneto-ionic device. The hydrogen insertion layer may also modulate the magnetic anisotropy of the magnetic layer and exhibit a change in the spin current generation efficiency when hydrogen is accumulated or removed from the hydrogen insertion layer.

All combinations of the foregoing concepts and additional concepts discussed in greater detail below (provided such concepts are not mutually inconsistent) are part of the inventive subject matter disclosed herein. In particular, all combinations of claimed subject matter appearing at the end of this disclosure are part of the inventive subject matter disclosed herein. The terminology used herein that also may appear in any disclosure incorporated by reference should be accorded a meaning most consistent with the particular concepts disclosed herein.

BRIEF DESCRIPTION OF DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 1C shows the anomalous Hall effect (AHE) resistance as a function of the magnetic field for a magneto-ionic device fabricated having no magnetization in the virgin state.

FIG. 1D shows the AHE resistance as a function of the magnetic field for the magneto-ionic device of FIG. 1C after applying a positive gate voltage.

FIG. 1E shows the AHE resistance as a function of the magnetic field for a magneto-ionic device fabricated having an out-of-plane magnetization in the virgin state.

FIG. 1F shows the AHE resistance as a function of the magnetic field for the magneto-ionic device of FIG. 1E after applying a negative gate voltage.

FIG. 2B shows a schematic illustration of the magneto-ionic device of FIG. 2A where a positive gate voltage is applied to inject hydrogen into the magneto-ionic device.

FIG. 2C shows a schematic illustration of the magneto-ionic device of FIG. 2A with accumulated hydrogen.

FIG. 3A shows the out-of-plane remanence magnetization ratio, $Mr/M_s$, as a function of time for several magneto-ionic devices comprising Pt(3 nm)/CoO(0.9 nm)/GdOx(20 nm)/Au(t nm) where the thickness of the Au electrode, t, is 3 nm, 4 nm, 6 nm, and 10 nm.

FIG. 3B shows an optical micrograph of the magneto-ionic device of FIG. 7A with t=4 nm and the corresponding magnetization ratio, $M_r/M_s$, as a function of position at 600 s.

FIG. 5A shows the demagnetizing field as a function of time for a magneto-ionic device subjected to a gate voltage of $V_g$=+4V and 0V.

FIG. 5B shows the damping constant as a function of time for a magneto-ionic device subjected to a gate voltage of $V_g$=+4V and 0V.

FIG. 5C shows the spin orbit torque as a function of time for a magneto-ionic device subjected to a gate voltage of $V_g$=+4V and 0V.

FIG. 6A shows an illustration of an exemplary magneto-ionic device in a virgin state.

FIG. 6B shows an illustration of the magneto-ionic device of FIG. 6A after a gate voltage $V_g$=+3V is applied for 800 s.

FIG. 6C shows an illustration of the magneto-ionic device of FIG. 6B after being short-circuited at a gate voltage $V_g$=0V for 800 s.

FIG. 6D shows the anomalous Hall effect (AHE) hysteresis loop corresponding to FIG. 6A.

FIG. 6E shows the AHE hysteresis loop corresponding to FIG. 6B.

FIG. 6F shows the AHE hysteresis loop corresponding to FIG. 6C.

FIG. 6G shows the planar Hall effect (PHE) hysteresis loop corresponding to FIG. 6A.

FIG. 6H shows the PHE hysteresis loop corresponding to FIG. 6B.

FIG. 6I shows the PHE hysteresis loop corresponding to FIG. 6C.

FIG. 7A shows the out-of-plane remanence magnetization ratio, $M_r/M_s$, and the corresponding gate voltage, $V_g$, as a function of time, t, under various gate voltages.

FIG. 7B shows a polar MOKE hysteresis loop corresponding to t=25 s in FIG. 7A, labelled (a).

FIG. 7C shows a polar MOKE hysteresis loop corresponding to t=110 s in FIG. 7A, labelled (b).

FIG. 7D shows a polar MOKE hysteresis loop corresponding to t=4200 s in FIG. 7A, labelled (c).

FIG. 7E shows a polar MOKE hysteresis loop corresponding to t=5600 s in FIG. 7A, labelled (d).

FIG. 7F shows an illustration of the magneto-ionic device corresponding to FIG. 7B.

FIG. 7G shows an illustration of the magneto-ionic device corresponding to FIG. 7C.

FIG. 7H shows an illustration of the magneto-ionic device corresponding to FIG. 7D.

FIG. 7I shows an illustration of the magneto-ionic device corresponding to FIG. 7E.

FIG. 8A shows the out-of-plane remanence magnetization ratio, $M_r/M_s$, as a function of time for the magneto-ionic device of FIG. 6A during cyclability testing.

FIG. 8B shows the polar MOKE hysteresis loop as a function of the magnetic field corresponding to the virgin state and the first switching cycle of FIG. 8A.

FIG. 8C shows the polar MOKE hysteresis loop as a function of the magnetic field corresponding to cycle 2070 of FIG. 8A.

DETAILED DESCRIPTION

Figure 1A:
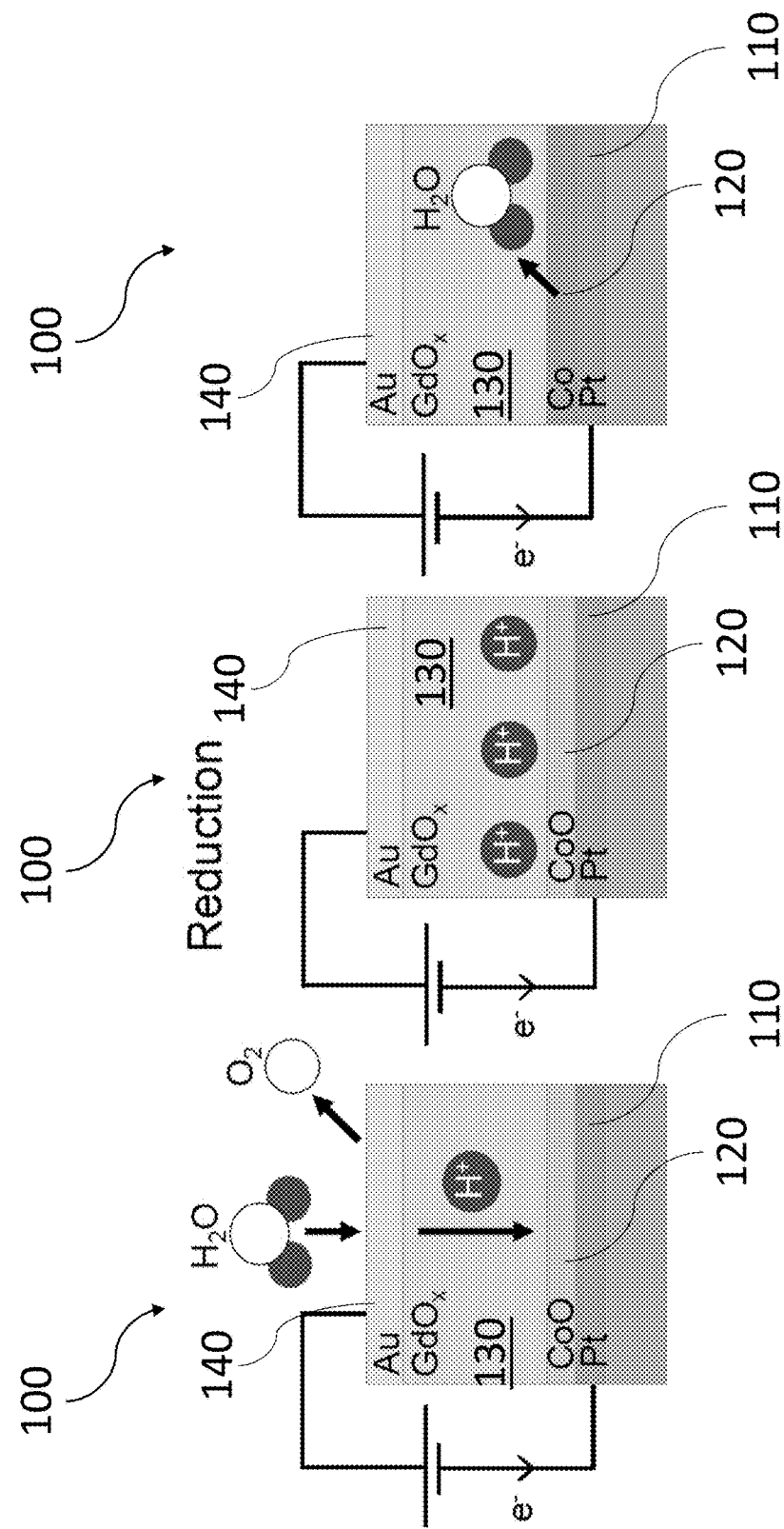
FIG. 1A shows a conventional reduction reaction for a magneto-ionic device operating using a redox-based magneto-ionic mechanism.

The development and integration of spintronic devices have remained limited, in part, by the lack of a robust approach to electrically gate magnetism, i.e., supplying an electrical input, such as a voltage or a current, to cause a desired change in a magnetic property. The electrical gating mechanism in a spintronic device should preferably provide for a large dynamic range of operation, a fast response, a low gate voltage, and a long operating lifetime. While electrical gating mechanisms have been demonstrated to modulate the magnetic properties of a magnet, these approaches typically exhibit one or more deficiencies that limit their incorporation into practical applications.

For instance, several electrical gating mechanisms have been developed to modulate the magnetic anisotropy of a magnet. For context, the modulation of the magnetic anisotropy can lead to a change in the magnetization of a magnetic material. The relationship between the magnetic anisotropy and the magnetization may be used as a basis for controlling a spintronic logic device or may serve as a means of measuring both properties, e.g., the magnetization may be measured in order to infer the magnetic anisotropy of the magnet.

Generally, the sign of the magnetic anisotropy, $K_{eff}$, determines the orientation of the magnetization in a magnet. A positive magnetic anisotropy ($K_{eff}>0$) corresponds to a magnetization oriented out-of-plane from the magnetic film and a negative magnetic anisotropy ($K_{eff}<0$) corresponds to a magnetization oriented in-plane with the magnetic film. The value of $K_{eff}$ is dictated by two contributions: (1) bulk anisotropy contribution (including shape anisotropy, magnetocrystalline anisotropy, etc.) and (2) a surface anisotropy contribution. In thin films, the shape anisotropy term is negative which stabilizes the in-plane orientation. And for most thin film devices, the surface is engineered so that they have a positive anisotropy contribution which stabilizes the out-of-plane orientation. Because these contributions are opposite in sign, their relative contributions dictate whether the magnetization is oriented in-plane or out-of-plane with the magnetic film. Their relative contributions depend, in part, on the properties and the geometry of the magnet and any interactions the magnet may have with adjoining materials.

In one example, the magnetoelectric effect was used to modify the magnetic anisotropy of a magnetic layer. In this approach, a voltage is applied across a magnetic heterostructure with broken inversion symmetry, which creates an electric field that causes electrons to preferentially fill certain electron orbitals in a magnetic layer with different out-of-plane characteristics (e.g., the electrons fill lower energy d-orbitals rather than higher energy d-orbitals). The different properties of the orbitals, when filled, can induce a change in magnetic anisotropy.

This approach can be used to rapidly switch between magnetic states at time scales on the order of nanoseconds. However, the change in magnetic anisotropy demonstrated thus far has been typically on the order of 0.01 erg/cm$^2$, which is impractically small for modulating high anisotropy materials in thermally stable spintronic devices. High anisotropy in spintronic devices prevents undesirable switching of the magnetic layer caused by thermal noise; typically, the magnitude is at least 60 kbT, where kb is the Boltzmann constant and T is the temperature, Furthermore, this approach has been demonstrated using various complex materials, such as multiferroic oxides, magnetic semiconductors, and strain coupled magnetostrictive/piezoelectric composites. These materials typically require high temperature processing, low temperature operation, and/or reduction in substrate-clamping effects during processing, which can lead to compatibility issues with conventional complementary metal-oxide-semiconductor (CMOS) processes.

In another example, a redox-based magneto-ionic mechanism was used to modify the magnetic anisotropy of a magnetic layer. Here, an applied voltage is used to induce ionic motion to transport ions in support of an oxidation reaction or a reduction reaction of the magnetic layer. The magnetic anisotropy of the magnetic layer can thus be changed by utilizing a reduction and oxidation reaction to modify the chemical structure of the magnetic layer.

Figure 1B:
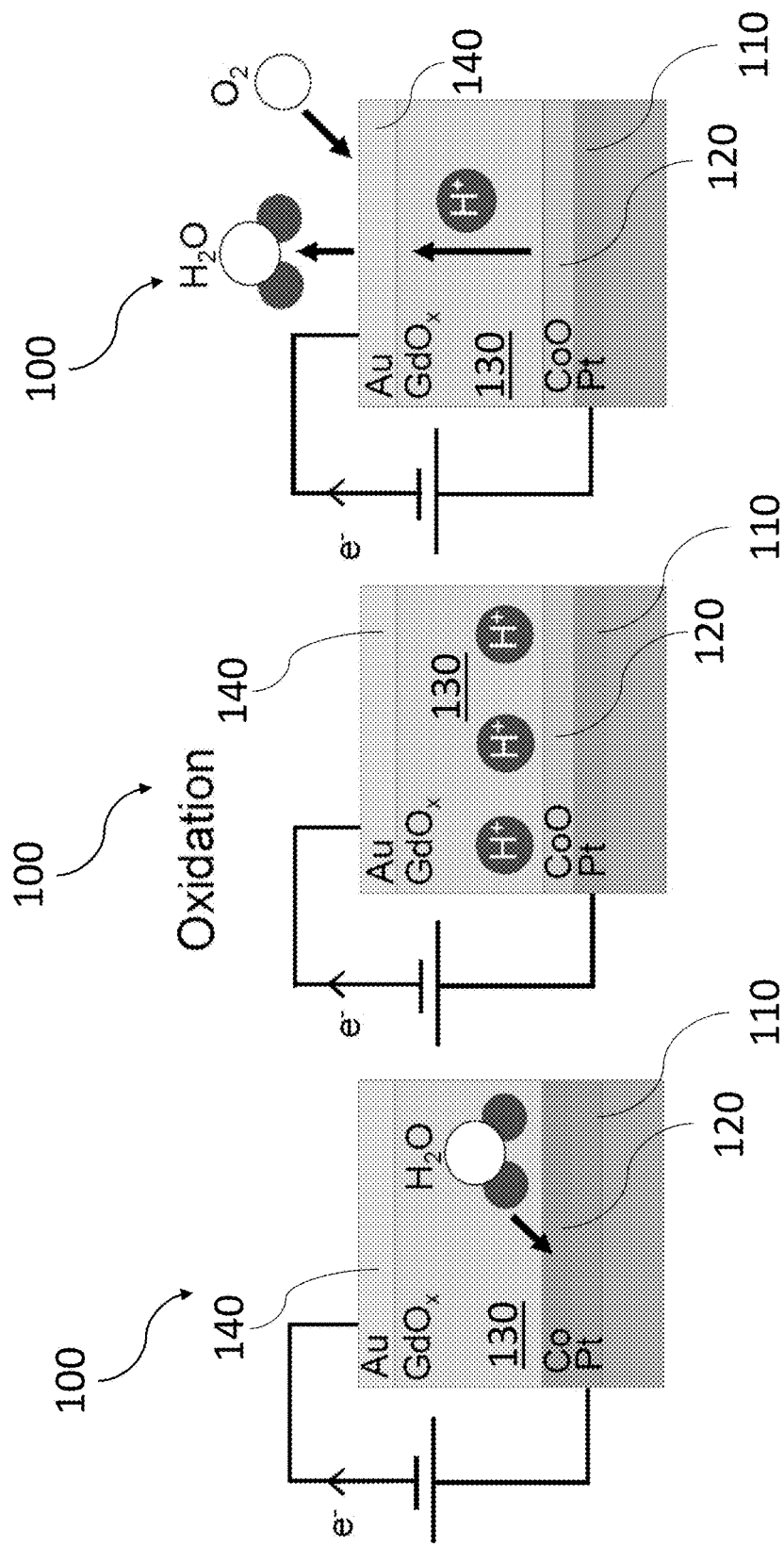
FIG. 1B shows the oxidation reaction of the redox-based magneto-ionic mechanism of FIG. 1A.

An exemplary oxidation and reduction reaction in a magneto-ionic device 100 is shown in FIGS. 1A and 1B. The magneto-ionic device 100 includes a first electrode 110 formed from platinum (Pt), a magnetic layer 120 disposed on the first electrode 110, an ionic conductor 130 disposed on the magnetic layer 120 formed from gadolinium oxide ($GdO_x$), and a second electrode 140 disposed on the ionic conductor 130 formed from gold (Au). The magnetic layer 120 transitions between cobalt (Co), a magnetic, metallic material, and cobalt oxide ($CoO_x$), a nonmagnetic material, based on the oxidation/reduction reaction, which results in the change in magnetic anisotropy. The first and second electrodes are connected to a voltage source configured to supply a gate voltage, $V_g$.

The reduction reaction of FIG. 1A occurs under a positive $V_g$ where $H_2O$ water molecules are hydrolyzed at the second electrode 140, producing $H^+$ and $O_2$ through an oxygen evolution reaction. The proton, $H^+$, is then transported to the first electrode 110 via a Grotthuss-type mechanism where the $H^+$ ion hops from an $OH^-$ to an adjacent $O^{2-}$ ion, enabled by solid-state dissolution of water in the ionic conductor 130. At the first electrode 110, the $H^+$ ion reacts with the $CoO_x$ magnetic layer 120 to form Co and $H_2O$. The net reactions are expressed as follows,

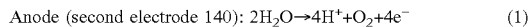

Anode (second electrode 140): $2H_2O \rightarrow 4H^+ + O_2 + 4e^-$ (1)

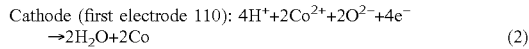

Cathode (first electrode 110): $4H^+ + 2Co^{2+} + 2O^{2-} + 4e^- \rightarrow 2H_2O + 2Co$ (2)

The water evolved at the first electrode 110 is either stored in the grain boundaries of the various layers of the magneto-ionic device 100 or incorporated into the ionic conductor 130, forming a hydroxide through the reaction: $Gd_2O_3 + 3H_2O \rightarrow 2Gd(OH)_3$.

The oxidation reaction of FIG. 1B occurs under a negative $V_g$ and follows the reverse reactions of Eqs. (1) and (2). In this case, the first electrode 110 acts as the anode to oxidize the Co magnetic layer 120 to form $CoO_x$ and the second electrode 140 acts as the cathode to recombine ions to form $H_2O$. For both the reduction and oxidation reactions of FIGS. 1A and 1B, the various ionic species of Eqs. (1) and (2) transport across the ionic conductor 130. However, the transport of $H^+$ protons is far more prevalent than the $O^{2-}$ due to the smaller atomic size and lower activation energy for the hopping mechanism described above.

FIGS. 1C-1D shows out-of-plane hysteresis loops based on the anomalous Hall effect resistance, $R_{AHE}$, for a magneto-ionic device 100 initially fabricated with a $CoO_x$ magnetic layer 120. The magneto-ionic device 100 includes a 4 nm tantalum (Ta) adhesion layer, a 3 nm Pt first electrode 110, a 0.9 nm $CoO_x$ magnetic layer 120, a 30 nm $GdO_x$ ionic conductor 130, and a 3 nm Au second electrode 140. FIG. 1C shows the $CoO_x$ magnetic layer 120 in the virgin state (i.e., as fabricated) does not exhibit any magnetization ($K_{eff}=0$). However, after applying a gate voltage $V_g=+3V$ for 1000 s at room temperature and under ambient conditions, an out-of-plane magnetization appears in FIG. 1D, indicating the magnetic anisotropy, $K_{eff}$, is now greater than 0 due to the reduction of $CoO_x$ to Co. The change in magnetic anisotropy is on the order of $10^7$ erg/cc or 1 erg/$cm^2$ if normalized to the Co thickness, which is substantially larger than the magnetoelectric effect described earlier.

FIGS. 1E-1F show out-of-plane hysteresis loops based on $R_{AHE}$ for a magneto-ionic device 100 initially fabricated with a Co magnetic layer 120 showing similar results to FIGS. 1C-1D. FIG. 1E shows the Co magnetic layer 120 in the virgin state exhibits an out-of-plane magnetization ($K_{eff}>0$). After applying a negative gate voltage $V_g=-3V$ for 1000 s at room temperature and under ambient conditions, FIG. 1F shows the disappearance of magnetization, indicating oxidation of the Co layer ($K_{eff}=0$). The change in magnetic anisotropy is again about 1 erg/$cm^2$.

As shown, the redox-based magneto-ionic approach can yield a substantially large change in magnetic anisotropy as observed in the reduction and oxidation reactions described above. Furthermore, such large changes in magnetic anisotropy were observed at relatively low gate voltages ($V_g=+3V$ or -3V during testing with a threshold voltage of about 1.5 V). However, the reduction and oxidation reactions described above are not reversible due to chemical and structural changes in the magnetic layer 120. For instance, during oxidation of a Co magnetic layer 120, the Co grains may not be evenly oxidized. When a subsequent reduction reaction occurs, portions of the $CoO_x$ magnetic layer 120 are reduced back to Co while other portions of the $CoO_x$ magnetic layer 120 are shielded from the applied electric field and are thus prevented from being reduced in subsequent cycles.

Figure 1H:
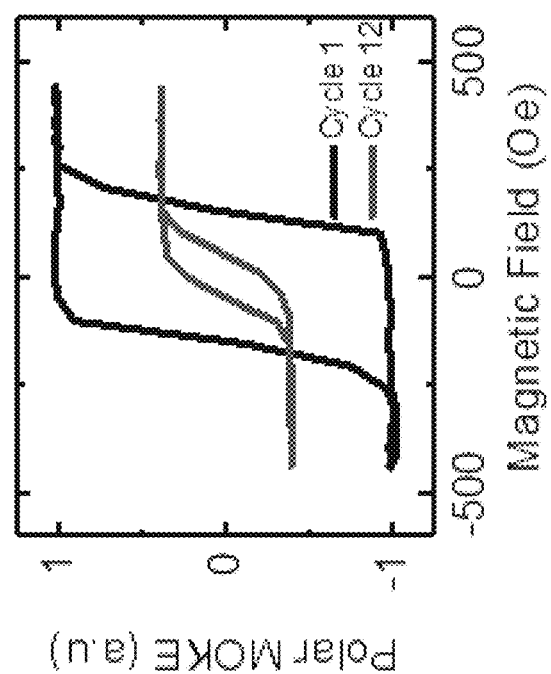
FIG. 1H shows polar magneto-optical Kerr effect (MOKE) hysteresis loops for cycle 1 and cycle 12 of FIG. 1G.
Figure 1G:
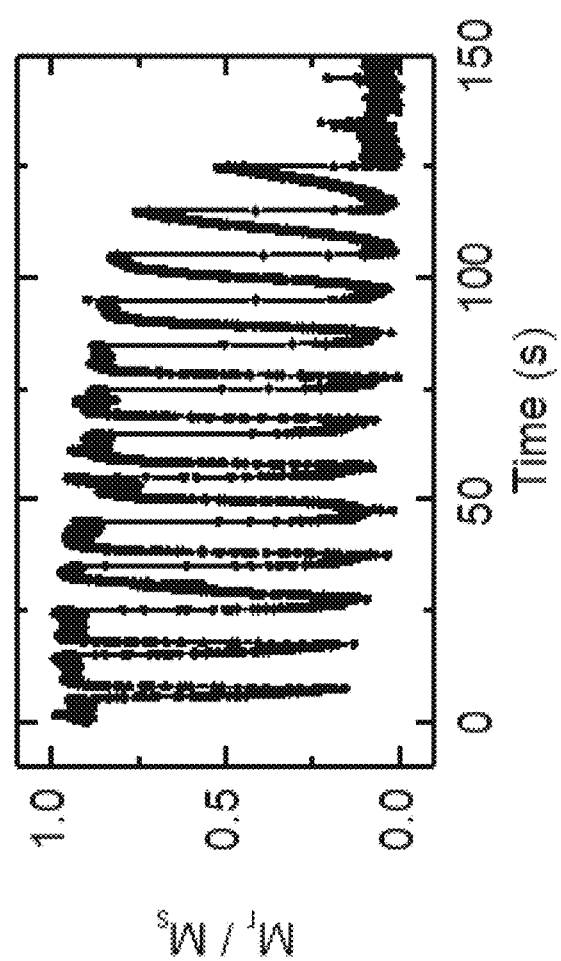
FIG. 1G shows the out-of-plane remanence magnetization ratio, $M_r/M_s$, as a function of time for the magneto-ionic device of FIG. 1A during cyclability testing.

FIG. 1G shows a plot of the remanent magnetization ratio, $M_r/M_s$, (the ratio of the remanent magnetization $M_r$ and the saturation magnetization $M_s$) as a function of time for a magneto-ionic device 100 with a 4 nm $GdO_x$ ionic conductor 130. The magneto-ionic device 100 is cycled between gate voltages of $V_g=+2V$ and -2V at a frequency of 0.1 Hz. As shown, the magnitude of the $M_r/M_s$ degrades over time as the portion of the shielded $CoO_x$ in the magnetic layer 120 increases. FIG. 1H shows a corresponding plot of the polar magneto-optical Kerr effect (MOKE) hysteresis loops at cycle 1 and cycle 12, showing a clear reduction in the magnetic signal as the magnetic layer 120 is switched between Co and $CoO_x$. The short operating lifetime (low number of cycles) therefore limits the practical use of a redox-based magneto-ionic mechanism that relies upon the oxidation and reduction reaction of the magnetic layer 120.

Magneto-Ionic Control via a Hydrogen Insertion and Removal

The present disclosure is thus directed to a magneto-ionic device that modulates the magnetic anisotropy of a magnetic layer using a hydrogen-gated magneto-ionic mechanism based on the insertion and removal of hydrogen ions (also referred to herein as "protons"). For this mechanism, a first voltage is applied to induce ionic motion such that protons are transported towards the magnetic layer where the protons can then reduce to hydrogen at an interface between the magnetic layer and an adjoining material. The presence of hydrogen at the interface can affect the surface anisotropy contribution to such an extent that the magnetic anisotropy of the magnetic layer can switch between positive and negative values, corresponding to an out-of-plane magnetization and an in-plane magnetization, respectively. The reverse process can occur by applying a second voltage with an opposite polarity to the first voltage, which causes hydrogen at the interface between the magnetic layer and an adjoining material to split into protons and electrons with the protons being transported away from the magnetic layer.

Compared to previous redox-based magneto-ionic approaches, the hydrogen-gated magneto-ionic approach disclosed herein does not rely upon chemical reactions that modify the chemical structure of the magnetic layer. Rather, the magnetic anisotropy can instead be modified by adjusting the amount of hydrogen located at the interface between the magnetic layer and the adjoining material. In this manner, the hydrogen-gated magneto-ionic approach can provide large changes to the magnetic anisotropy without causing chemical and structure degradation of the magnetic layer, resulting in a longer operating lifetime. Similar to the redox-based magneto-ionic approach, the hydrogen-gated magneto-ionic approaches can operate at relatively low gate voltages between about −1V and about 4V, as will be discussed later on. Thus, the hydrogen-gated magneto-ionic approach provides several desirable attributes for use as an electrical gating mechanism in spintronic devices.

The use of hydrogen ions, which is atomically smaller and more mobile than previously used oxygen ions, allows for faster proton transport through a magneto-ionic device, resulting in a faster switching speed compared to redox-based magneto-ionic approaches at about 100 ms to about 400 ms. Compared to previous magnetoelectric-based approaches, the hydrogen-gated magneto-ionic approach is slower. However, several applications may be configured to be less sensitive to the switching speed. For example, in spin-transfer torque magnetic random-access memory (STT-MRAM) devices, voltage gating can be used to switch blocks of cells into a low anisotropy state for fast STT-writing followed by a high anisotropy state for long-term retention, so that the writing power can be substantially reduced due to reductions in the switching current. Other examples where switching speed is less critical to device performance includes neuromorphic and stochastic computing.

Figure 2A:
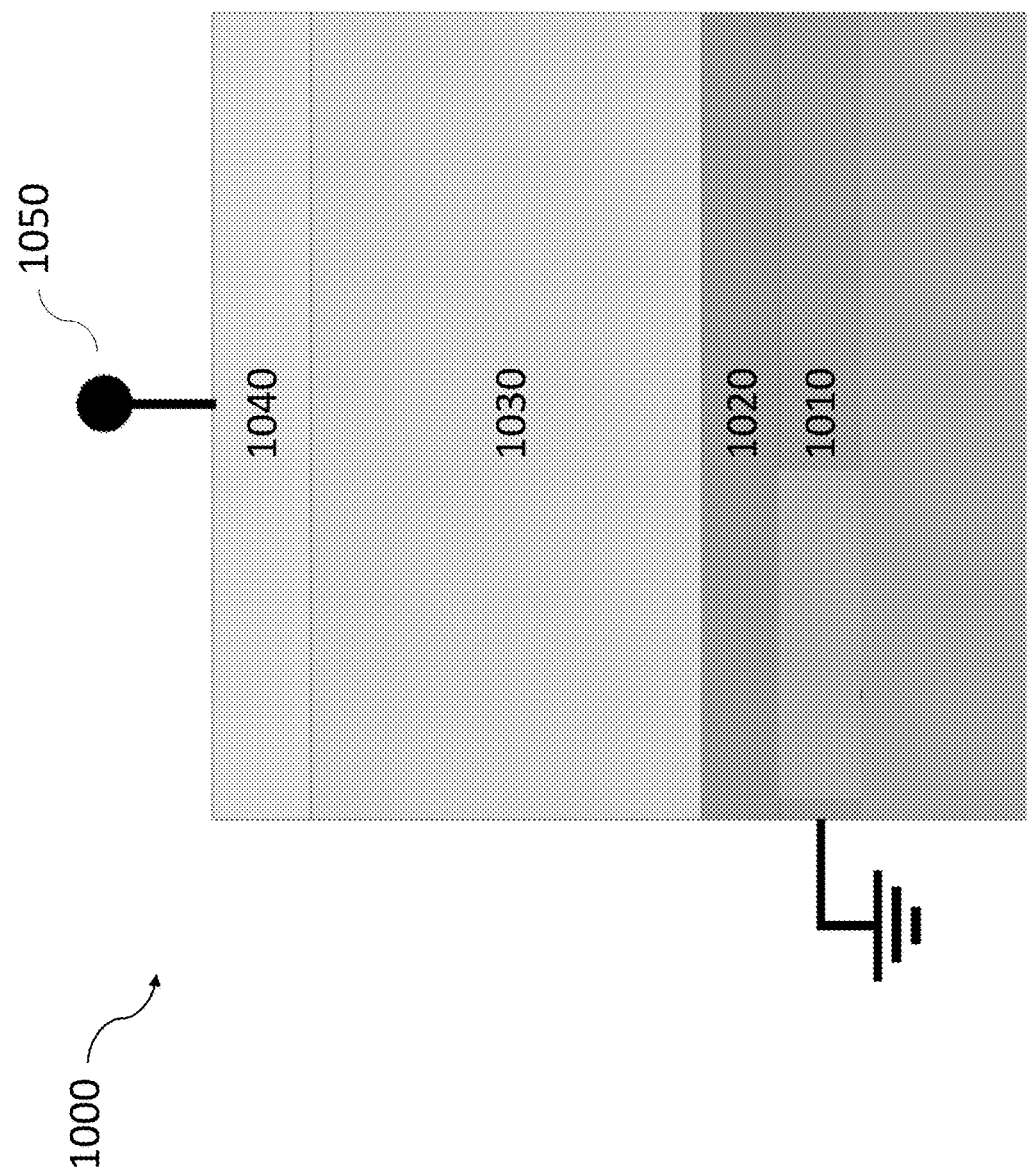
FIG. 2A shows an exemplary magneto-ionic device that operates using a hydrogen-gated magneto-ionic mechanism.

FIG. 2A shows an exemplary magneto-ionic device 1000 configured to modulate the magnetic anisotropy based on a hydrogen-gated magneto-ionic mechanism. The magneto-ionic device 1000 may include a first electrode 1010 and a second electrode 1040. The first electrode 1010 and the second electrode 1040 may be electrically coupled to a voltage source 1050 configured to apply a gate voltage, $V_g$, to the first electrode 1010 and the second electrode 1040. The first electrode 1010 and/or the second electrode 1040 may also be used to catalyze hydrogen evolution reactions in the magneto-ionic device 1000. A magnetic layer 1020 may be disposed between the first electrode 1010 and the second electrode 1040. A proton conductor 1030 may then be disposed between the magnetic layer 1020 and the second electrode 1040. The proton conductor 1030 is used to transport protons between the second electrode 1040 and the magnetic layer 1020 when a gate voltage is applied to the first electrode 1010 and the second electrode 1040. As hydrogen ions are moved either towards or away from the magnetic layer 1020, the magnetic layer 1020 may switch between at least two magnetic states.

FIGS. 2B-2C show an exemplary process illustrating the use of the hydrogen-gated magneto-ionic mechanism to switch the magnetic layer 1020 in the magneto-ionic device 1000 between at least two states. The magneto-ionic device 1000 may initially be in a first magnetic state where the magnetic layer 1020 has a positive magnetic anisotropy corresponding to an out-of-plane magnetization relative to the plane of the magnetic layer 1020 (e.g., a Co magnetic layer 1020 adjoining a $GdO_x$ proton conductor 1030). As shown in FIG. 2B, when a positive gate voltage, $V_g$, is applied, $H_2O$ molecules from the ambient may be hydrolyzed at the second electrode 1040, resulting in the generation of hydrogen ions (i.e., protons). The protons may then be transported towards the magnetic layer 1020 via a Grotthuss-type mechanism, as described above, under the electric field generated by the applied potential. At the magnetic layer 1020, the protons may then react with electrons flowing through the magneto-ionic device 1000 to form hydrogen in a hydrogen evolution reaction. The net reactions are expressed as follows,

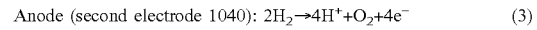

Anode (second electrode 1040): $2H_2O \rightarrow 4H^+ + O_2 + 4e^-$ (3)

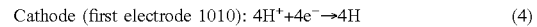

Cathode (first electrode 1010): $4H^+ + 4e^- \rightarrow 4H$ (4)

As shown, the reactions in Eqs. (3) and (4) do not cause any changes to the chemical structure of the magnetic layer 1020 unlike previous redox-based magneto-ionic approaches.

FIG. 2C shows the magneto-ionic device 1000 with hydrogen accumulated at the interface between the magnetic layer 1020 and the proton conductor 1030. When hydrogen accumulates in this manner, the magnetic layer 1020 may transition from the first magnetic state to a second magnetic state with a negative magnetic anisotropy corresponding to an in-plane magnetization. The second magnetic state may be maintained by continually supplying a positive gate voltage, in which case hydrogen may continue to accumulate, or by disconnecting the magneto-ionic device 1000 to form an open circuit, as will be discussed in more detail below. The gate voltage may be at least about 1.3 V, corresponding to the water-splitting potential and the hydrogen loading voltage in the proton conductor 1030. Kinetic barriers may be present in the magneto-ionic device 1000, resulting in a larger gate voltage (at least about +2V) to induce the reactions in Eqs. (3) and (4).

The processes shown in FIGS. 2B-2C and expressed in Eqs. (3) and (4) are reversible. The reverse processes may occur by connecting the magneto-ionic device 1000 to a closed circuit (e.g., a short circuit) with a gate voltage of $V_g=0V$ or by applying a negative gate potential $V_g<0V$. The hydrogen may be split into protons and electrons, transported towards the second electrode 1040, and recombined with atmospheric oxygen to form $H_2O$. The exemplary processes depicted in FIGS. 2B-2C are also based on the hydrolysis of $H_2O$ sourced from the ambient environment. However, $H_2O$ may instead be sourced from a hydrogen storage layer integrated into the magneto-ionic device 1000. In other designs, the source of protons and/or hydrogen may originate from a different reaction or process.

First Electrode

The first electrode 1010 provides an electrical contact to electrically couple the magneto-ionic device 1000 to the voltage source 1050. In some cases, the first electrode 1010 may be connected to an electrical ground, as shown in FIG. 2A, or the negative terminal of the voltage source 1050. Thus, a positive gate voltage may correspond to the second electrode 1040 having a higher voltage than the first electrode 1010 and a negative gate voltage may correspond to the first electrode 1010 having a higher voltage than the second electrode 1040. The voltage source 1050 may be in the form of circuitry integrated with the magneto-ionic device 1000 (e.g., circuitry and the magneto-ionic device 1000 are fabricated onto the same wafer or substrate) where one or more interconnects are used to couple the first electrode 1010 to the circuitry. The voltage source 1050 may also be a physically separate device connected to the first electrode 1010 using various connection mechanisms including, but not limited to, wire bonding, soldering, flip chip mounting, and probe needles.

The first electrode 1010 may have a thin film geometry with a thickness that ranges between about 1 nm and about 100 nm. The first electrode 1010 may also be deposited onto a substrate and used to provide a base layer supporting subsequent layers in the magneto-ionic device 1000. The substrate may be formed from various materials including, but not limited to, silicon (e.g., thermally oxidized Si with a (100) crystal orientation) and glass (e.g., $SiO_2$). Depending on the material of the first electrode 1010 and the substrate, an adhesion layer may be deposited onto the substrate to reduce the likelihood the first electrode 1010 delaminates from the substrate during subsequent processing, handling, or operation. The adhesion layer may have a thickness ranging between about 1 nm and about 100 nm.

The first electrode 1010 may thus be formed from various electrically conducting materials including, but not limited to, gold, silver, copper, platinum, palladium, iridium, rhenium, ruthenium, rhodium, indium, tin, bismuth, antimony, 3d transition metals, or any alloys of the foregoing known to one of ordinary skill in the art. Various deposition methods may be used to deposit the first electrode 1010 including, but not limited to, direct current sputtering, magnetron sputtering, radio-frequency sputtering, e-beam deposition, chemical vapor deposition, pulsed laser deposition, atomic layer deposition, and molecular beam epitaxy. In particular, the first electrode 1010 may be designed using materials compatible with CMOS processing. If used, the adhesion layer may be formed from various materials including, but not limited to, tantalum, titanium, and chromium.

The first electrode 1010 may also be patterned to have various geometries and dimensions. For example, the first electrode 1010 may be deposited as a film onto a wafer and then subsequently patterned in order to define the geometry of one or more magneto-ionic devices 1000 disposed onto the wafer. The first electrode 1010 may be patterned to have lateral dimensions as small as about 7 nm. For example, the first electrode 1010 may have lateral dimensions of about 500 μm for testing and prototyping such as in a Hall cross geometry. In another example, the first electrode 1010 may have dimensions less than about 100 nm for integration into an integrated circuit. Various patterning processes can be used including, but not limited to, shadow mask lithography, photolithography, interference lithography, and e-beam lithography.

In some cases, the first electrode 1010 may also be used to catalyze a hydrogen evolution reaction, e.g., Eqn. (4), during operation in order to increase the rate at which the magneto-ionic device 1000 can switch between different magnetic states. For example, the first electrode 1010 may be formed from platinum, which is one of the best known catalysts for the hydrogen evolution reaction. However, for practicality and cost, other metals may still be used, such as palladium, cobalt, nickel, copper, or any alloys of the foregoing, at the expense of a slower reaction rate.

Second Electrode

Similar to the first electrode 1010, the second electrode 1040 provides a corresponding electrical contact to electrically couple the magneto-ionic device 1000 to the voltage source 1050. As suggested above, the second electrode 1040 may be connected to a positive terminal of the voltage source 1050. Depending on the manner in which the voltage source 1050 is coupled to the magneto-ionic device 1000 (e.g., integrated or physically separate with electrical connections), the second electrode 1040 may be coupled to the voltage source 1050 using various connection mechanisms including, but not limited to, interconnects, wire bonding, soldering, flip chip mounting, and probe needles.

The second electrode 1040 may have a thin film geometry with a thickness ranging between about 1 nm to about 100 nm. In designs where the magneto-ionic device 1000 sources hydrogen from ambient environment, the thickness of the second electrode 1040 can affect the switching speed/time response of the magneto-ionic device 1000. For designs where the magneto-ionic device 1000 has a hydrogen storage layer between the second electrode 1040 and the proton conductor 1030, the thickness of the second electrode does not affect the switching speed. FIG. 3A shows the remanent magnetization ratio, $M_r/M_s$, as a function of time for several magneto-ionic devices 1000 fabricated with variable second electrode 1040 thicknesses ranging between 3 nm and 10 nm. As shown, the response time can increase by nearly a factor of 10 from a thickness of 3 nm to 10 nm. For the magneto-ionic device 1000 coupled to the external proton source, it may be important for the second electrode 1040 to be uniform in thickness to reduce variability in response time between multiple magneto-ionic devices 1000 disposed across a wafer. FIG. 3B shows an optical image of the magneto-ionic device 1000 with a 4 nm thick second electrode 1040 and the corresponding $M_r/M_s$ as a function of position across the magneto-ionic device 1000. As shown, the edges of the second electrode 1040 are thinner due to shadowing effects from shadow mask lithography, which results in a higher $M_r/M_s$ at the edges compared to the center of the magneto-ionic device 1000. The sensitivity of the magneto-ionic device 1000 to the uniformity of the second electrode 1040 may be reduced by incorporating a hydrogen storage layer within the magneto-ionic device 1000.

The second electrode 1040 may be positioned at an opposing side to the first electrode 1010 in the magneto-ionic device 1000 such that the first electrode 1010 and the second electrode 1040 flank the magnetic layer 1020 and the proton conductor 1030. For example, if the first electrode 1010 is disposed on a substrate at the base of the magneto-ionic device 1000, the second electrode 1040 may be the top-most layer in the magneto-ionic device 1000. Depending on the material used to form the second electrode 1040 and the material onto which the second electrode 1040 is deposited, an adhesion layer may be used to reduce unwanted delamination of the second electrode 1040. However, unlike the first electrode 1010, the adhesion layer, if used, should be carefully designed with an appropriate thickness and/or an appropriate material so as to avoid interfering with the generation and/or transport of protons from the second electrode 1040 to the proton conductor 1030.

The second electrode 1040 may be formed from various electrically conducting materials including, but not limited to, gold, silver, copper, platinum, palladium, iridium, rhenium, ruthenium, rhodium, indium, tin, bismuth, antimony, 3d transition metals, or any alloys of the foregoing known to one of ordinary skill in the art. Various deposition methods may be used to deposit the second electrode 1040 including, but not limited to, direct current sputtering, magnetron sputtering, radio-frequency sputtering, e-beam deposition, chemical vapor deposition, pulsed laser deposition, atomic layer deposition, and molecular beam epitaxy. In particular, the second electrode 1040 may be designed using materials compatible with CMOS processing. If used, the adhesion layer may be formed from various materials including, but not limited to, tantalum, titanium, and chromium.

The second electrode 1040 may also be patterned to have various geometries and dimensions. In particular, the second electrode 1040 may be patterned to have lateral dimensions as small as about 7 nm. In some cases, the second electrode 1040 may be patterned in order to provide access to the first electrode 1010, which may be otherwise be inaccessible due to being embedded between the substrate and the other layers of the magneto-ionic device 1000. For example, the second electrode 1040 may be removed along a portion of the magneto-ionic device 1000 (e.g., the periphery or the interior of the magneto-ionic device 1000) and the underlying layers, such as the magnetic layer 1020 and the proton conductor 1030 are etched to provide access to the first electrode 1010 from the same side as the second electrode 1040. The etched region of the magneto-ionic device 1000 may then be infilled with an electrical conductor (e.g., the same materials as the first electrode 1010) such that the first electrode 1010 and the second electrode 1040 are accessible across the same plane. In another example, the substrate may instead be etched to provide access to the first electrode 1010 from the opposite side to the second electrode 1040. Various patterning processes can be used including, but not limited to, shadow mask lithography, photolithography, interference lithography, and e-beam lithography.

The second electrode 1040 may also be used, in some instances, as a catalyst to support the generation and/or reduction of protons. For example, in the exemplary reaction of Eq. (3), the second electrode 1040 can be used to catalyze a water-splitting reaction to generate hydrogen ions and oxygen under a positive gate voltage. The second electrode 1040 may be formed from a noble metal, such as platinum, gold, or silver, which can catalyze the water-splitting reaction with support from an oxide, such as the proton conductor 1030 if formed used an oxide material. Similar to the first electrode 1010, other metals may still be used, such as palladium, cobalt, nickel, copper, or any alloys of the foregoing, to reduce cost despite a slower reaction rate.

Proton Conductor

The proton conductor 1030 is primarily used to transport protons between the magnetic layer 1020 and the second electrode 1040. In order to increase the switching speed/response time of the magneto-ionic device 1000, the proton conductor 1030 should preferably have a larger proton conductance. The proton conductance generally depends on both the proton conductivity, an intrinsic material property, and the dimensions along which protons travel. For example, high proton conductivity materials typically have a proton conductivity ranging between about $10^{-3}$ S/cm and about $10^{-1}$ S/cm. However, for ultrathin magneto-ionic devices (e.g., the total thickness between the first electrode 1010 and the second electrode 1040 is less than about 50 nm), the response time may still be less than about 1 s, even when using a proton conductor 1030 with a proton conductivity of about $10^{-10}$ S/cm. Therefore, a thin film proton conductor 1030 should preferably have a proton conductivity ranging between about $10^{-10}$ S/cm and about $10^{-1}$ S/cm and a thickness ranging between about 3 nm to about 1 μm.

The proton conductance may also be improved by water dissolution into the proton conductor 1030. For example, perovskites, such as barium zirconium oxide ($BaZrO_3$) or barium cerium oxide ($BaCeO_3$), can support high concentrations of oxygen vacancies, which in turn allows high levels of water dissolution into the solid based on the following reaction, expressed in Kroger-Vink defect notation: $H_2O + O^x_o + V''_o \rightarrow 2OH'_o$. $O^x_o$ represents an oxygen ion on a normal oxygen site, $V''_o$ an oxygen vacancy with net double positive charge relative to the normally occupied lattice site, and $OH'_o$ a singly positively charged proton localized around an oxygen ion sitting on a normal oxygen site. The increase in $OH'_o$ sites can enhance proton transport through the proton conductor 1030.

Figure 4B:
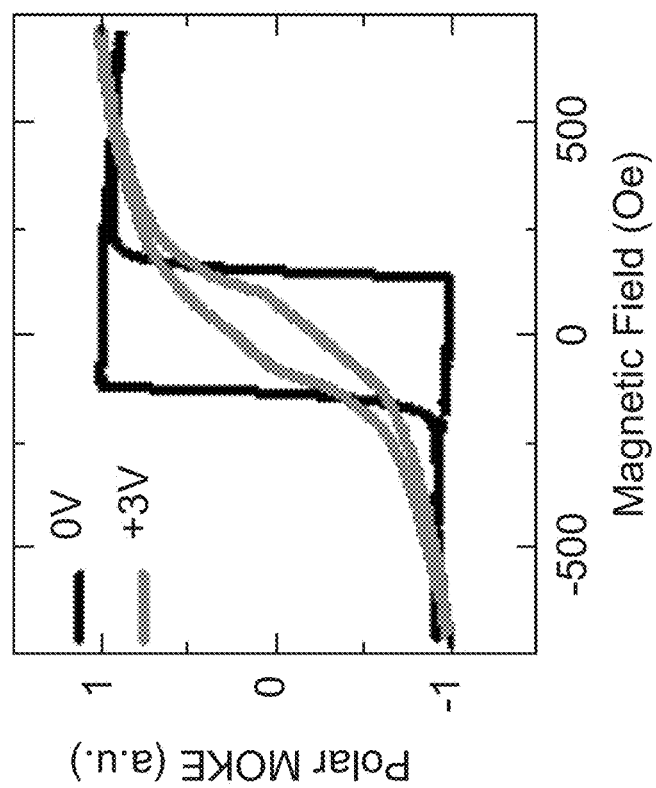
FIG. 4B shows a polar MOKE hysteresis loop of a magneto-ionic device where vacuum was broken for 2 weeks between deposition of the proton conductor and the second electrode.
Figure 4A:
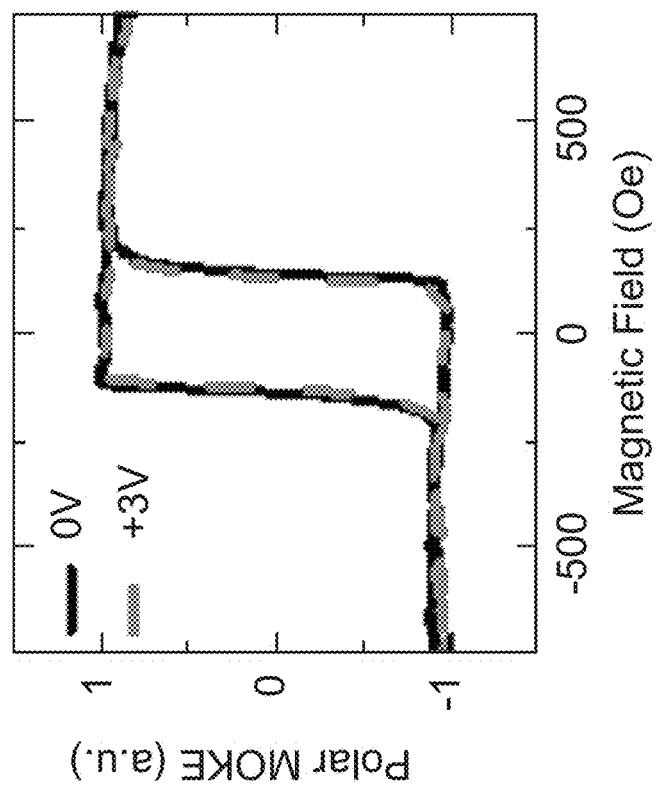
FIG. 4A shows a polar MOKE hysteresis loop of a magneto-ionic device prepared without breaking vacuum.

For example, FIGS. 4A-4B show polar MOKE hysteresis loops for two magneto-ionic devices 1000 prepared under two conditions: (1) the second electrode 1040 is deposited in-situ under vacuum using a shadow mask without breaking vacuum, and (2) the second electrode 1040 is deposited after first exposing the $GdO_x$ proton conductor 1030 to ambient atmosphere for 2 weeks. Each magneto-ionic device 1000 is comprised of a 3 nm Pt first electrode 1010, a 0.9 nm thick Co magnetic layer 1020, a 4 nm thick $GdO_x$ proton conductor 1030, 1.4 nm Ta adhesion layer, and a 5 nm Au second electrode 1040. FIG. 4A shows that no magneto-ionic effects can be observed when the magneto-ionic device 1000 is prepared under condition (1). In contrast, the magneto-ionic device 1000 prepared under condition (2) exhibits magneto-ionic switching when a positive gate voltage is applied as shown in FIG. 4B. The difference may be attributed, in part, to an uptake of water in the magneto-ionic device 1000 prepared under condition (2) from the ambient environment, which may be especially enhanced by the hygroscopic character of $GdO_x$.

Additionally, the proton conductor 1030 should also have a low electrical conductance such that electrons transport only through an external current path (e.g., the voltage source 1050) coupled to the magneto-ionic device 1000 rather than through the proton conductor 1030. During operation, parasitic leakage currents through the proton conductor 1030 can limit the time period a magnetic state can be retained in the magneto-ionic device 1000. For example, when the magneto-ionic device 1000 in FIGS. 2B-2C is loaded with hydrogen, subsequent short-circuiting of the magneto-ionic device 1000 with zero gate voltage will cause the hydrogen to form protons, which then diffuse towards the second electrode 1040. This process, as expressed in Eqs. (3) and (4), can only occur if electrons can flow between the first electrode 1010 and the second electrode 1040. During regular operation, magnetic states can thus be retained in the magneto-ionic device 1000 by controllably disconnecting the magneto-ionic device 1000 from an external circuit. However, if electrons can instead flow through the proton conductor 1030, these parasitic leakage currents can cause the hydrogen loaded into the magneto-ionic device 1000 to decrease over time, resulting in an unwanted loss of the magnetic state. Similar to the proton conductance, the electrical conductance depends on both the electrical conductivity of a material and the geometry. Based on the preferred thicknesses of the proton conductor 1030, the electrical conductivity should preferably be less than about $10^{-10}$ S/cm.

The material used to form the proton conductor 1030 may also affect the magnetic properties of the magnetic layer 1020. For example, an oxide adjoining the magnetic layer 1020 may cause oxygen hybridization to occur at the interface between the oxide and the magnetic layer 1020. Oxygen hybridization can result in a surface anisotropy contribution that prefers the magnetization of the magnetic layer 1020 to orient out-of-plane. This surface anisotropy contribution is also referred to as a perpendicular magnetic anisotropy (PMA). For applications where it is preferred the magnetic layer 1020 initially have an out-of-plane magnetization, the proton conductor 1030 can thus be formed from an oxide that forms an oxygen bond between the oxide and the magnetic layer 1020 that stabilizes the out-of-plane magnetization. Additionally, the choice of material for the proton conductor 1030 may also affect the ease in switching between magnetic states in the proton conductor 1030. For example, $GdO_x$ exhibits a large spin orbit coupling, which may be used to change other magnetic properties of the magnetic layer 1020 discussed below.

The proton conductor 1030, as described above, is primarily used to transport protons in the magneto-ionic device 1000. Thus, the proton conductor 1030 may be formed from perovskites including, but not limited to, gadolinium-doped cerium oxide, barium cerium oxide, barium zirconium oxide, and yttrium stabilized zirconia. However, in applications where speed is less important, the proton conductor 1030 may be formed from other oxides including, but not limited to, gadolinium oxide, yttrium oxide, oxygen-deficient titanium oxide, and terbium oxide. Various deposition methods may be used to deposit the proton conductor 1030 including, but not limited to, direct current sputtering, magnetron sputtering, radio-frequency sputtering, e-beam deposition, chemical vapor deposition, pulsed laser deposition, atomic layer deposition, and molecular beam epitaxy.

The proton conductor 1030 may also be patterned to have various geometries and dimensions in accordance to the geometry and dimensions of other layers in the magneto-ionic device 1000. Various patterning processes can be used including, but not limited to, shadow mask lithography, photolithography, interference lithography, and e-beam lithography.

Magnetic Layer

The magnetic layer 1020 may support at least two magnetic states, which can be toggled based on the hydrogen-gated magneto-ionic mechanism described in the present disclosure. This switching functionality can be used in several applications, such as representing data, controlling the flow of magnetic particles, or sensing current or magnetic fields. As described above, the magnetic states may correspond to different magnetic properties including, but not limited to, magnetic anisotropy, magnetic damping, spin-orbit torque efficiency, and exchange interactions, such as DMI and the RKKY interaction. During operation, one or more of these magnetic properties may change simultaneously. Thus, the hydrogen-gated magneto-ionic mechanism can enable voltage-gating of various spin-orbital and exchange effects, which may have a broad range of applications. FIGS. 5A-5C show several plots of various magnetic properties as a function of time for an exemplary magneto-ionic device 1000. A gate voltage $V_g$=+4V is initially applied to the magneto-ionic device 1000 and subsequently turned off ($V_g$=0V) thereafter. As shown, a measurable change can be observed in the magnetic anisotropy, the damping, and the spin-orbit torque.

As described above, the magnetic layer 1020 may support at least a first magnetic state and a second magnetic state. In several of the applications described herein, the first magnetic state and the second magnetic state may correspond to a preferred magnetic anisotropy. For example, the first magnetic state may be a positive magnetic anisotropy ($K_{eff}$>0), which corresponds to the magnetic layer 1020 having an out-of-plane magnetization. The second magnetic state may be a negative magnetic anisotropy ($K_{eff}$<0), which corresponds to the magnetic layer 1020 having an in-plane magnetization. The resultant change between the first magnetic state and the second magnetic state may be at least $10^6$ erg/cc in order to improve, in part, the thermal stability of the magneto-ionic device 1000. These magnetic states may result in large, measurable changes in the anomalous Hall effect (AHE) resistance and the planar Hall effect (PHE) resistance, which may form the basis for a Hall effect device.

In another example, the first magnetic state and the second magnetic state may both have a positive magnetic anisotropy, but with different amplitudes. The first magnetic state may have a magnetic anisotropy substantially larger (e.g., greater than $10^7$erg/cc) than the second magnetic state (e.g. between about $10^6$ erg/cc and $10^7$erg/cc). For example, the magnetic layer 1020 may be initially configured to have an out-of-plane magnetization corresponding to the first magnetic state. By applying a gate voltage to reduce the magnetic anisotropy (i.e., the second magnetic state), an external stimulus (e.g., a spin-transfer torque, a spin-orbit torque) may be applied causing the magnetic layer 1020 to transition to a third magnetic state once the gate voltage is removed. The third magnetic state may also have a positive magnetic anisotropy and an out-of-plane magnetization, but the magnetization may be oriented in an opposite direction compared to the first magnetic state. In this manner, the hydrogen-gated magneto-ionic mechanism may be used to reduce an energy barrier (i.e., the magnetic anisotropy) to enabling switching between two distinct magnetization states. This approach may be useful in magnetic tunnel junction devices in order to switch the magnetization of a free magnet.

In yet another example, the first magnetic state and the second magnetic state may correspond to different values of magnetic damping. These magnetic states may be used, for instance, in brake systems, e.g., Eddy current brakes, for electric motors.

Similar to the other layers described above, the magnetic layer 1020 may be a thin film with a thickness ranging between about 0.5 nm and about 100 nm. In some cases, the thickness of the thin film may be adjusted, in part, to tune the magnetic anisotropy by controlling the relative contributions of bulk and surface anisotropies. For example, thicker films typically exhibit a larger bulk shape anisotropy contribution, resulting in a lower $K_{eff}$ whereas thinner films typically exhibit a larger surface anisotropy contribution, resulting in a higher $K_{eff}$.

The magnetic layer 1020 may be formed from various magnetic materials including, but not limited to, cobalt, iron (Fe), Ni, rare earth metals and alloys of these. Various deposition methods may be used to deposit the proton conductor 1030 including, but not limited to, direct current sputtering, magnetron sputtering, radio-frequency sputtering, e-beam deposition, chemical vapor deposition, pulsed laser deposition, atomic layer deposition, and molecular beam epitaxy. The magnetic layer 1020 may also be patterned to have various geometries and dimensions in accordance to the geometry and dimensions of other layers in the magneto-ionic device 1000.

Hydrogen Source

As described above, the magneto-ionic device 1000 may be coupled to a hydrogen source configured to supply, in part, protons to the magneto-ionic device 1000 directly or indirectly. For example, the hydrogen source may be the ambient environment surrounding the magneto-ionic device 1000. The ambient environment contains water molecules, which may be split into protons and oxygen with a water-splitting reaction, as shown in Eqs. (3) and (4), thus supplying protons in an indirect manner. The performance of the magneto-ionic device 1000, an open system in this case, may depend, in part, on the amount of water vapor in the ambient environment, which can fluctuate based on the type of environment as well as variations within the environment over time.

Thus, for practical deployment, it is preferable for the magneto-ionic device 1000 to be a closed system. This may be accomplished by integrating a hydrogen source into the magneto-ionic device 1000 to supply and/or receive protons during operation. For example, a hydrogen storage layer may be disposed between the proton conductor 1030 and the second electrode 1040. The hydrogen storage layer may be formed from a material that can store large amount of hydrogen or water. The hydrogen storage layer can thus supply hydrogen, which may oxidize to form proton by applying a gate voltage. By positioning the hydrogen storage layer between the first electrode 1010 and the second electrode 1040, protons generated as from the hydrogen storage layer may be transported across the proton conductor 1030 when a gate voltage is applied to the magneto-ionic device 1000. Additionally, the amount of hydrogen stored in the hydrogen storage layer may be adjusted based on the thickness of the hydrogen storage layer. In some cases, the hydrogen storage layer may be tuned to provide a sufficient number of protons such that the magnetic layer 1020 can switch between two desired magnetic states. The hydrogen storage layer may be formed from various materials including, but not limited to, oxides like tungsten oxide ($WO_3$) and molybdenum oxide ($MoO_3$).

In another example, the hydrogen storage layer may be formed from metals with large hydrogen loading capacities, such as palladium or platinum. When hydrogen is loaded into such heavy metals, hydrides may be formed, e.g., $PdH_x$, $PtH_x$. As will be discussed below, hydrogen may be pumped into or out of such hydrides when a gate voltage is applied to the magneto-ionic device 1000 causing the metal to transition between a metal and a metal hydride phase with markedly different magnetic properties. If used as a hydrogen storage layer, metals may be used to supply protons to the magneto-ionic device 1000.

The hydrogen storage layer may be deposited using similar methods described above including, but not limited to, direct current sputtering, magnetron sputtering, radio-frequency sputtering, e-beam deposition, chemical vapor deposition, pulsed laser deposition, atomic layer deposition, and molecular beam epitaxy. Additionally, the hydrogen storage layer may be treated such that water and/or hydrogen is incorporated into the hydrogen storage layer prior to the fabrication subsequent layers in the magneto-ionic device 1000. The hydrogen storage layer may also be patterned to have various geometries and dimensions in accordance to the geometry and dimensions of other layers in the magneto-ionic device 1000.

Hydrogen Insertion Layer

In some cases, the magneto-ionic device 1000 may include a hydrogen insertion layer disposed between the proton conductor 1030 and the magnetic layer 1020. The hydrogen insertion layer may be used to store or release hydrogen when a gate voltage is applied to the magneto-ionic device 1000. Thus, the hydrogen insertion layer may be formed from metals which form hydrides such as palladium or platinum. The hydrogen insertion layer may also catalyze the hydrogen evolution reaction, speeding up the formation of hydrogen from the protons transported through the magneto-ionic device 1000.

The inclusion of the hydrogen insertion layer can provide several benefits to the operation of the magneto-ionic device 1000. First, the hydrogen insertion layer can protect the magnetic layer 1020 such that a negative gate voltage can be applied without causing oxidation of the magnetic layer 1020. Thus, the reverse processes of Eqs. (3) and (4), which previously relied upon diffusion for hydrogen removal, can be accelerated under a negative gate voltage resulting in a faster transition (e.g., less than 1 s between magnetic states). For example, a negative gate voltage potential between about −1 V and about 0 V can be applied to the magneto-ionic device 1000.

Second, the storage of hydrogen in the hydrogen insertion layer can still be used to modulate the magnetic anisotropy of the magnetic layer 1020 and hence, does not impact the operation of the magneto-ionic device 1000, as previously described.

Third, the magnetic properties of the hydrogen insertion layer may be modified with the accumulation or removal of hydrogen. For example, the hydrogen insertion layer, if formed from a large spin hall angle material, may have a spin current generation efficiency that changes based on the amount of hydrogen stored in the hydrogen insertion layer. The modulation of the spin current generation efficiency may reduce the amount of energy for a spin-transfer torque or a spin-orbit torque to switch the magnetic layer 1020 between different magnetic states (e.g., the first magnetic state corresponds to an out-of-plane magnetization and the second magnetic state corresponds to an out-of-plane magnetization oriented opposite to the first magnetic state).

The hydrogen insertion layer may be a thin film with thicknesses ranging between about 3 nm and about 100 nm. The hydrogen insertion layer may be formed using materials having a large hydrogen loading capacity and/or a large spin orbit coupling including, but not limited to, Pd, Pt, W, Ta, Hf, Nb, V, Mo, Ru, Rh, Re, Tc, Tl, Ti, Ag, Cu, Zn, Re, Mg, Bi, Sn, Sb, Te, In, Ga, Gd, Tb, Nd, La, Ce, Sm, Eu, Dy, or an alloy thereof, such as a magnesium-nickel alloy or lanthanum-nickel alloy. The hydrogen insertion layer may be deposited using similar methods described above including, but not limited to, direct current sputtering, magnetron sputtering, radio-frequency sputtering, e-beam deposition, chemical vapor deposition, pulsed laser deposition, atomic layer deposition, and molecular beam epitaxy. The hydrogen insertion layer may also be patterned to have various geometries and dimensions in accordance to the geometry and dimensions of other layers in the magneto-ionic device 1000.

An Exemplary Magneto-Ionic Device with 1120 Hydrolysis

In this section, an exemplary magneto-ionic device 2000 will be described with accompanying experimental data characterizing the performance of the magneto-ionic device 2000. The magneto-ionic device 2000 is designed to receive water from an ambient environment, which may be split by a water-splitting reaction to form protons. The protons, under an applied potential, move from the second electrode 2040 towards the magnetic layer 2020 where the protons then reduce to form hydrogen. The hydrogen causes the magnetic layer 2020 to transition from a first magnetic state to a second magnetic state.

The magneto-ionic device 2000 is comprised of a 4 nm thick Ta adhesion layer, a 3 nm thick Pt first electrode 2010, a 0.9 nm thick magnetic layer 2020, a 30 nm thick $GdO_x$ proton conductor 2030, and a 3 nm thick Au second electrode 2040. The magneto-ionic device 2000 was fabricated on a thermally oxidized Si (100) substrate using magnetron sputtering at room temperature and 3 mTorr Ar pressure. The metal layers were grown by DC sputtering. The $GdO_x$ layer was deposited either using reactive sputtering with $P_{O2}$ of 0.07 mTorr or RF sputtering with $P_{O2}$ of 0.7 mTorr $O_2$. For AHE and PHE resistance measurements, the magneto-ionic device 2000 is patterned using a Hall cross geometry with 500 μm arm width and the second electrode 2040 deposited over the 0.25 mm² active region to serve as a gate electrode. For MOKE measurements, the second electrode 2040 is a 200 μm diameter electrodes patterned on the proton conductor 2030, which is a continuous film. The first electrode was uncovered by the proton conductor 2030 at the sample edge to allow for electrical contact to the first electrode 2010. All patterning was done using shadow mask lithography. The measured leakage current in the proton conductor 2030 films is <1 nA at $V_g$=+2V for magneto-ionic devices 2000 with a diameter of 200 μm and a 30 nm thick proton conductor 2030.

Figure 6J:
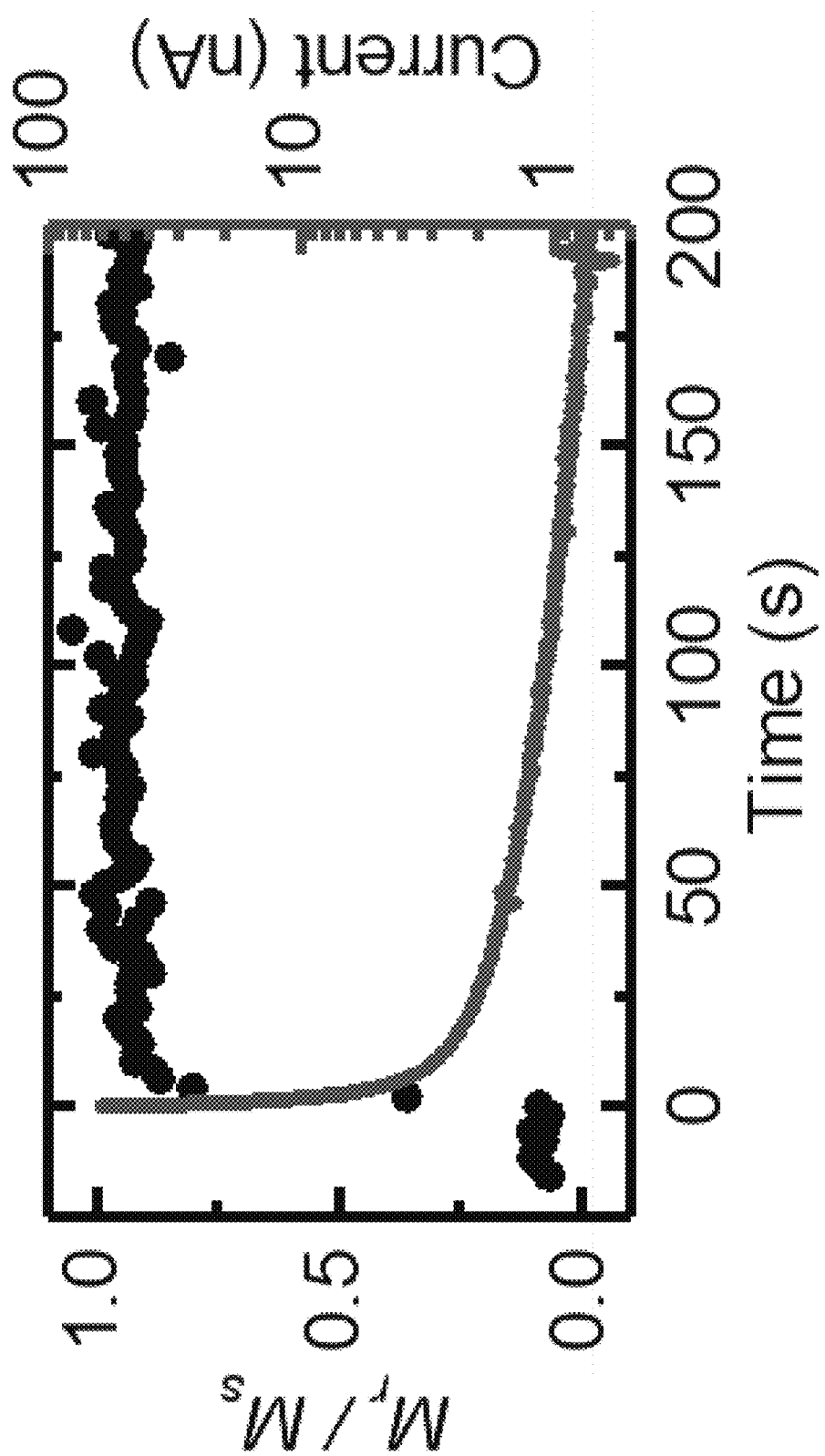
FIG. 6J shows the out-of-plane remanence magnetization ratio, $M_r/M_s$, and the discharge current as a function of time corresponding to the transition between FIG. 6B and FIG. 6C.

FIGS. 6A-6C show schematic illustrations of the magneto-ionic device 2000 detailing the hydrogen-gated magneto-ionic mechanism that enables the magneto-ionic device 2000 to modulate the magnetic anisotropy. FIG. 6A shows the magneto-ionic device 2000 in a virgin state where the magnetic layer 2020 is configured to have a PMA. FIG. 6B shows that when a gate voltage $V_g=+3V$ is applied for 800 s, the magnetization of the magnetic layer 2020 rotates in-plane corresponding to accumulation of hydrogen at the interface between the magnetic layer 2020 and the proton conductor 2030. FIG. 6C shows that when the gate voltage is set to $V_g=0V$ (i.e., grounding the magneto-ionic device 2000), the PMA is spontaneously recovered as the accumulated hydrogen forms protons, $H^+$, and diffuses away from the first electrode 2010.

FIGS. 6D-6F show plots of the AHE hysteresis loops corresponding to FIGS. 6A-6C, respectively. FIGS. 6G-6I show plots of the PHE hysteresis loops corresponding to FIGS. 6A-6C, respectively. As shown in FIGS. 6D and 6G, the magnetic layer 2020 initially has PMA as indicated by the observation of a AHE signal and the absence of a PHE signal. Once the positive gate voltage is applied in FIGS. 6E and 6H, the AHE signal disappears while the PHE signal appears, indicating the magnetization reorients from an out-of-plane magnetization to an in-plane magnetization based on the changes to the magnetic anisotropy. Once the gate voltage is removed, the magneto-ionic device 2000 returns back to its initial state as shown in FIGS. 6F and 6I. It should be noted that accumulation of hydrogen that causes the magnetization reorientation transition only occurs when the magneto-ionic device 2000 operates in an ambient environment with humidity (i.e., the ambient environment contains a sufficient amount of water molecules). Additionally, the magnetoelectric efficiency to change the magnetic anisotropy was estimated to be about 5000 fJ/Vm, similar to the highest values reported for redox-based magneto-ionic methods.

As previously described, the reactions in Eqs. (3) and (4) can only occur when electrons can flow through an external circuit coupled to the magneto-ionic device 2000 between the first electrode 2010 and the second electrode 2040 assuming leakage currents are negligible. Two possible operating modes arise as a result of this behavior: (1) grounding the magneto-ionic device 2000 ($V_g=0V$) or (2) leaving the magneto-ionic device 2000 at open circuit when $V_g$ is removed. FIG. 7A shows a plot of the magnetization ratio, $M_r/M_s$, and the applied gate voltage, $V_g$, as a function of time, t. Four periods are labelled in FIG. 7A: (a) the magneto-ionic device 2000 in its default state prior to the application of a gate voltage, (b) a positive gate voltage $V_g=+3V$ is applied between t=30 s and 100 s, (c) the magneto-ionic device 2000 is disconnected from the voltage source resulting in an open circuit, (d) the magneto-ionic device 2000 is reconnected to the voltage source and the gate voltage is set to $V_g=0V$ (i.e., ground) at t=5300 s.

After $V_g=+3V$ is applied, the magnetization of the magnetic layer 2020 transitions from out-of-plane (FIG. 7B) to in-plane (FIG. 7C) corresponding to insertion and accumulation of hydrogen as illustrated in FIGS. 7F and 7G. When the magneto-ionic device 2000 is set to open circuit, the in-plane magnetization is retained between t=100 s and 5300 s as shown in FIGS. 7C and 7D. This suggests the accumulated hydrogen remains at the interface between the proton conductor 2030 and the magnetic layer 2020. For a magneto-ionic device 2000 with very low leakage, this hydrogen-loaded state was shown to be retained for more than 3 days in ambient conditions and at least a week under vacuum conditions (e.g., $10^{-4}$ mbarr). When the magneto-ionic device 2000 is subsequently set to closed circuit, PMA is spontaneously recovered (FIG. 7E) corresponding to the removal of hydrogen from the magneto-ionic device 2000 as shown in FIGS. 7H and 7I.

The magnetization state can thus be switched in a non-volatile fashion between out-of-plane and in-plane states, or toggled with a unipolar voltage, depending on whether the $V_g=0V$ condition is at open or closed circuit. The ability to modify the magnetic state of the magneto-ionic device 2000 over two very distinct timescales can be particularly attractive for neuromorphic computing where one can modify the memory (non-volatile) during computation and once the computation is complete, all memory elements are reinitialized to the same state during a refresh stage (volatile).

Cyclability tests were also performed on the magneto-ionic device 2000 to assess the operating lifetime of the magneto-ionic device 2000, especially when compared to previous redox-based magneto-ionic approaches. A magneto-ionic device 2000 with a 4 nm thick $GdO_x$ proton conductor 2030 was used to increase the switching speed for testing. The gate voltage, $V_g$, was cycled more than 2000 times between $V_g=+3V$ and 0V at a frequency of 0.5 Hz. Out-of-plane hysteresis loops were acquired at 25 ms intervals using a polar magneto-optical Kerr effect (MOKE) polarimeter.

Figure 8E:
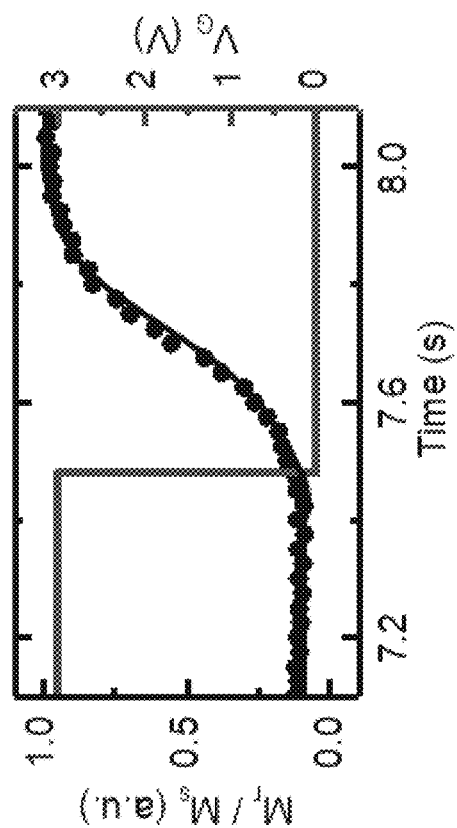
FIG. 8E shows the out-of-plane remanence magnetization ratio, $M_r/M_s$, as the gate voltage, $V_g$, falls in FIG. 8A.
Figure 8D:
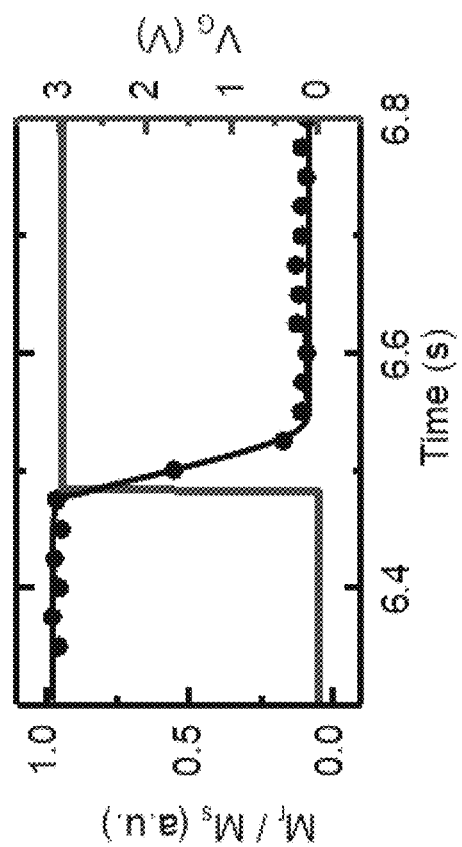
FIG. 8D shows the out-of-plane remanence magnetization ratio, $M_r/M_s$, as the gate voltage, $V_g$, rises in FIG. 8A.

FIG. 8A shows the magnetization ratio, $M_r/M_s$, as a function of time, for cycles 1-10 and 2060-2070. FIGS. 8B and 8C shows the out-of-plane hysteresis loops for the virgin magneto-ionic device 2000, cycle 1, and cycle 2070. FIG. 8B shows the square out-of-plane loop in the virgin state is indistinguishable from the loop after toggling the magnetization in plane, both after the first cycle and after cycle 2070 (FIG. 8C). The response time, however, degrades slightly with repeated cycling, which may be associated with increased leakage currents in the oxide. The switching times at the rising and falling $V_g$ edge are 100 ms and 400 ms, respectively, as shown in FIGS. 8D and 8E. This switching speed is substantially faster than conventional magneto-ionic switching mechanisms previously demonstrate at room temperature. The asymmetry in switching can be reduced by applying a negative $V_g$ to accelerate the removal of protons from the interface between the proton conductor 2030 and the magnetic layer 2020. However, this may also result in oxidation of the magnetic layer 2020 resulting in chemical and structural degradation of the magnetic layer 2020, which limits the operating lifetime as observed in redox-based magnet-ionic approaches.

The spontaneous recovery of the PMA in the magnetic layer 2020 after a gate voltage $V_g=+3V$ is applied is driven by a chemical potential (Nernst potential), which tends to drive the reactions in Eqs. (3) and (4) in reverse. FIG. 6I shows the remanent magnetization ratio, $M_r/M_s$, and the discharge current of a magneto-ionic device 2000 comprised of a 10 nm thick $GdO_x$ proton conductor 2030 as a function of time once a short-circuit is applied after a gate voltage of $V_g=+3V$ is applied. Immediately after applying the positive gate voltage and injecting hydrogen, the magneto-ionic device 2000 exhibits an open circuit voltage of ~1.2V corresponding to the chemical potential.

Once the device is set to a closed circuit, the reverse reactions of Eqs. (3) and (4) occur, leading to a measurable current flow, as shown in FIG. 6I. The discharge current flows in the opposite direction relative to the current under a positive gate voltage, indicating recombination of stored hydrogen. Integration of the discharge current in the first 5 seconds shows that removal of ~40 nC or $4.1\times10^{-13}$ mol of hydrogen leads to full recovery of PMA. This corresponds to ~1H for every 10 Co atoms assuming a Co density of 8.9 g/cc and a molar mass of 58.9 g/mol. This ratio represents an upper bound to the amount of hydrogen used to toggle the magnetization of the magnetic layer 2020 between an in-plane and out-of-plane state. The actual value may be much smaller since the amount of hydrogen immediately adjacent to the interface between the proton conductor 2030 and the magnetic layer 2020 may be substantially less than the total amount of hydrogen stored in the proton conductor 2030.

An Exemplary Magneto-Ionic Device with a Hydrogen Insertion Layer

Figures 9A, 9B:
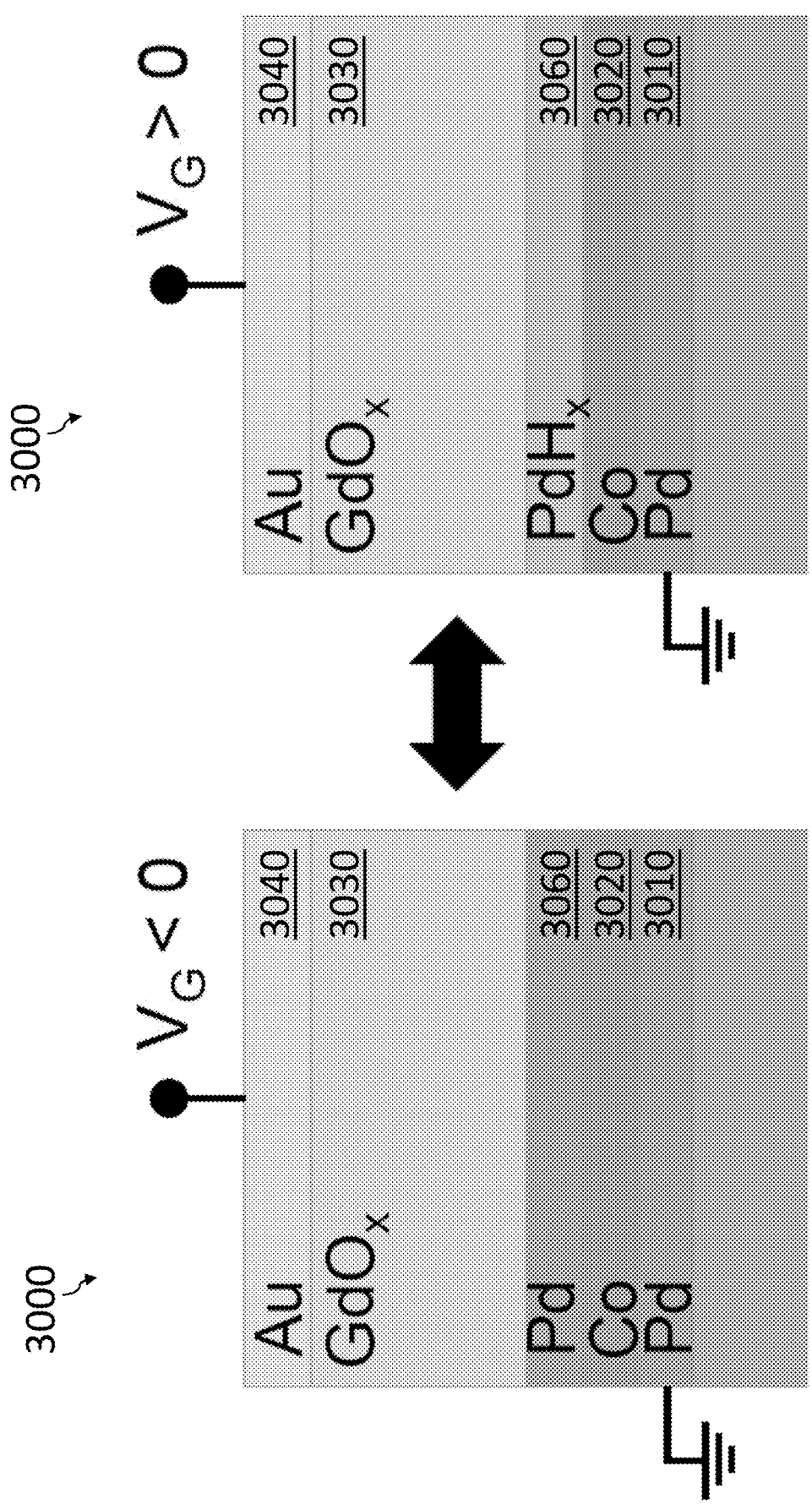
FIG. 9A shows an illustration of an exemplary magneto-ionic device with a hydrogen insertion layer when a negative gate voltage, $V_g$, is applied to a hydrogen loaded state.
FIG. 9B shows an illustration of the magneto-ionic device of FIG. 9A when a positive $V_g$ is applied to a virgin device.

This section discloses an exemplary magneto-ionic device 3000 with a hydrogen insertion layer and experimental data characterizing the performance of the magneto-ionic device 3000. The magneto-ionic device 3000 is schematically illustrated in FIGS. 9A and 9B. The magneto-ionic device 3000 is comprised of a 4 nm thick Ta adhesion layer, a 3 nm thick Pd first electrode 3010, a 0.6 nm thick Co magnetic layer 3020, a 4.5 nm thick hydrogen insertion layer 3050, a 10 nm thick $GdO_x$ proton conductor 3030, and a 3 nm thick Au second electrode 3040. The magneto-ionic device 3000 may be fabricated using processes similar to the fabrication of the magneto-ionic device 2000.

Figure 10A:
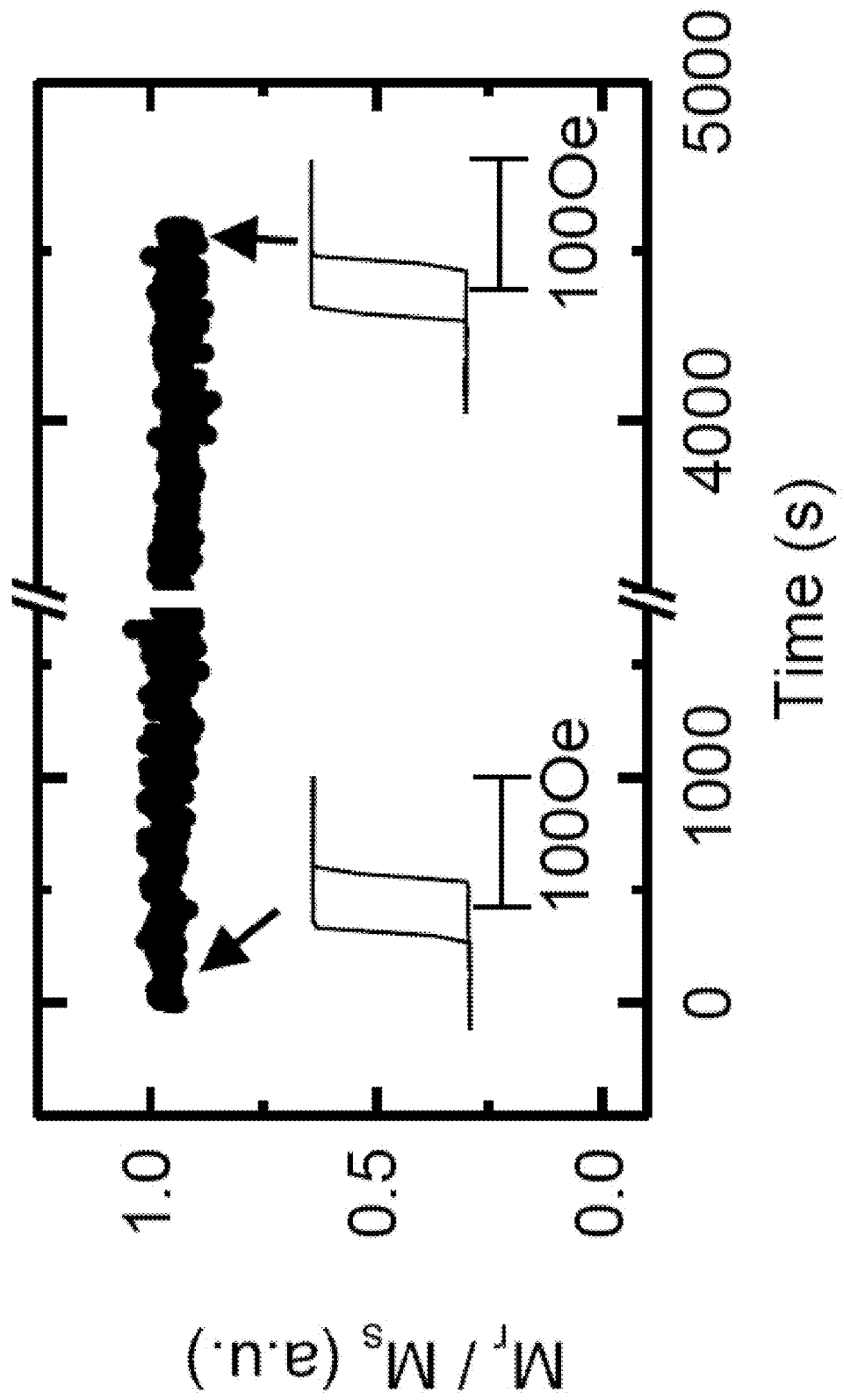
FIG. 10A shows the out-of-plane magnetization remanence ratio, $M_r/M_s$, as a function of time for the magneto-ionic device of FIG. 9A and FIG. 9B.

FIG. 9B shows that a positive gate voltage, $V_g$, injects hydrogen into the hydrogen insertion layer 3050 causing the Pd to form a hydride of $PdH_x$. The accumulation of hydrogen may be used to change the magnetic anisotropy of the magnetic layer 3020 from an out-of-plane magnetization to an in-plane magnetization as before. However, FIG. 9A shows the inclusion of the Pd hydrogen insertion layer 3050 protects the magnetic layer 3020 such that a negative gate voltage does not cause the magnetic layer 3020 to appreciably oxidize. In order to verify that a negative gate voltage does not cause oxidation of the magnetic layer 3020, a gate voltage $V_g=-3V$ is applied to the magneto-ionic device 3000 for a time period of about 4500 s. FIG. 10A shows the magnetization ratio, $M_r/M_s$, as a function of time, t. Polar magneto-optical Kerr effect (MOKE) hysteresis loops are also shown at t=0 s and 4500 s. As shown, $M_r/M_s$ does not exhibit an appreciable change between t=0 s and t=4500 s, thus confirming that the magnetic layer 3020 does not exhibit observable signs of oxidation. The ability to apply a negative gate voltage to the magneto-ionic device 3000 can thus be used to accelerate hydrogen removal and recovery of PMA in the magnetic layer 3020.

Figures 10B, 10C, 10D:
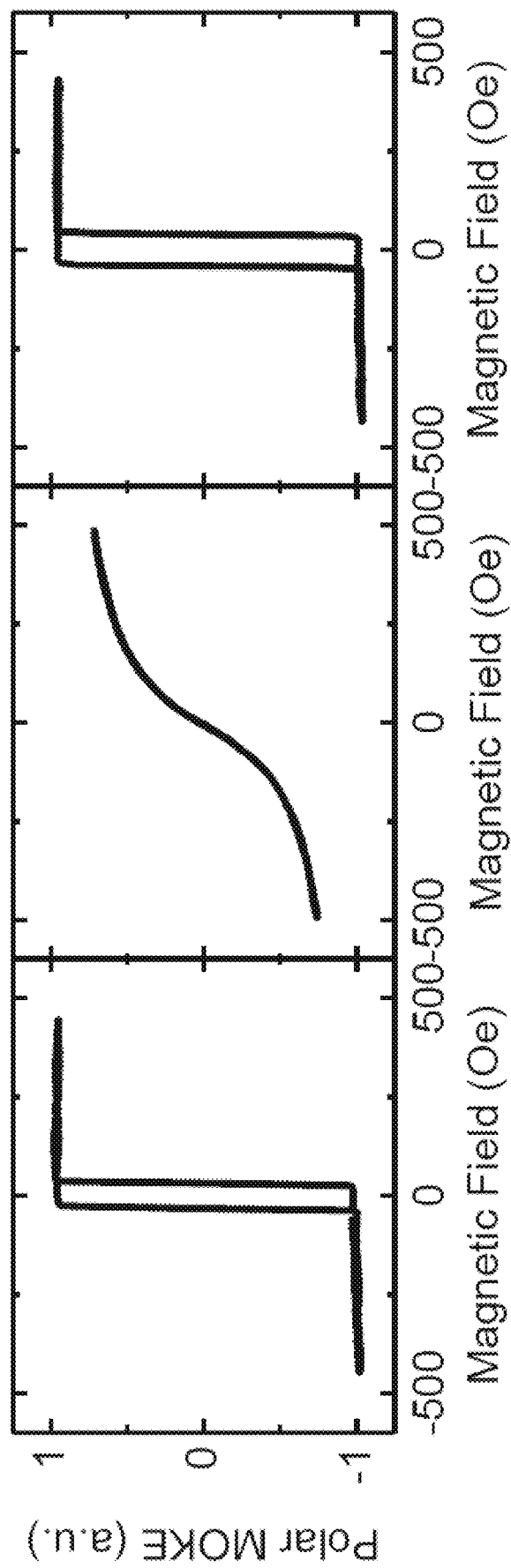
FIG. 10B shows the polar MOKE hysteresis loop of the magneto-ionic device of FIG. 9A and FIG. 9B in the virgin state.
FIG. 10C shows the polar MOKE hysteresis loop of the magneto-ionic device of FIG. 9A and FIG. 9B after a gate voltage of $V_g=+4V$ is applied.
FIG. 10D shows the polar MOKE hysteresis loop of the magneto-ionic device of FIG. 9A and FIG. 9B after a gate voltage of $V_g=-1V$ is applied.

A positive and negative gate voltage can thus be applied to the magneto-ionic device 3000 to pump hydrogen into and out of the hydrogen insertion layer 3050 in a reversible manner such that the magnetic anisotropy is modulated between an out-of-plane magnetization and an in-plane magnetization. FIGS. 10B-10D show polar MOKE hysteresis loops corresponding to the virgin state of the magneto-ionic device 3000, after a gate voltage of $V_g=+4V$ is applied, and after a gate voltage of $V_g=-1V$ is applied, respectively. FIG. 10B shows the magnetic layer 3020 initially has a positive magnetic anisotropy corresponding to an out-of-plane magnetization. When the positive gate voltage is applied, FIG. 10C shows the magnetic layer 3020 transitions to having an in-plane magnetization. FIG. 10D then shows when the negative gate voltage is applied, the magnetic layer 3020 returns to the out-of-plane magnetization observed in FIG. 10B.

Figure 11A:
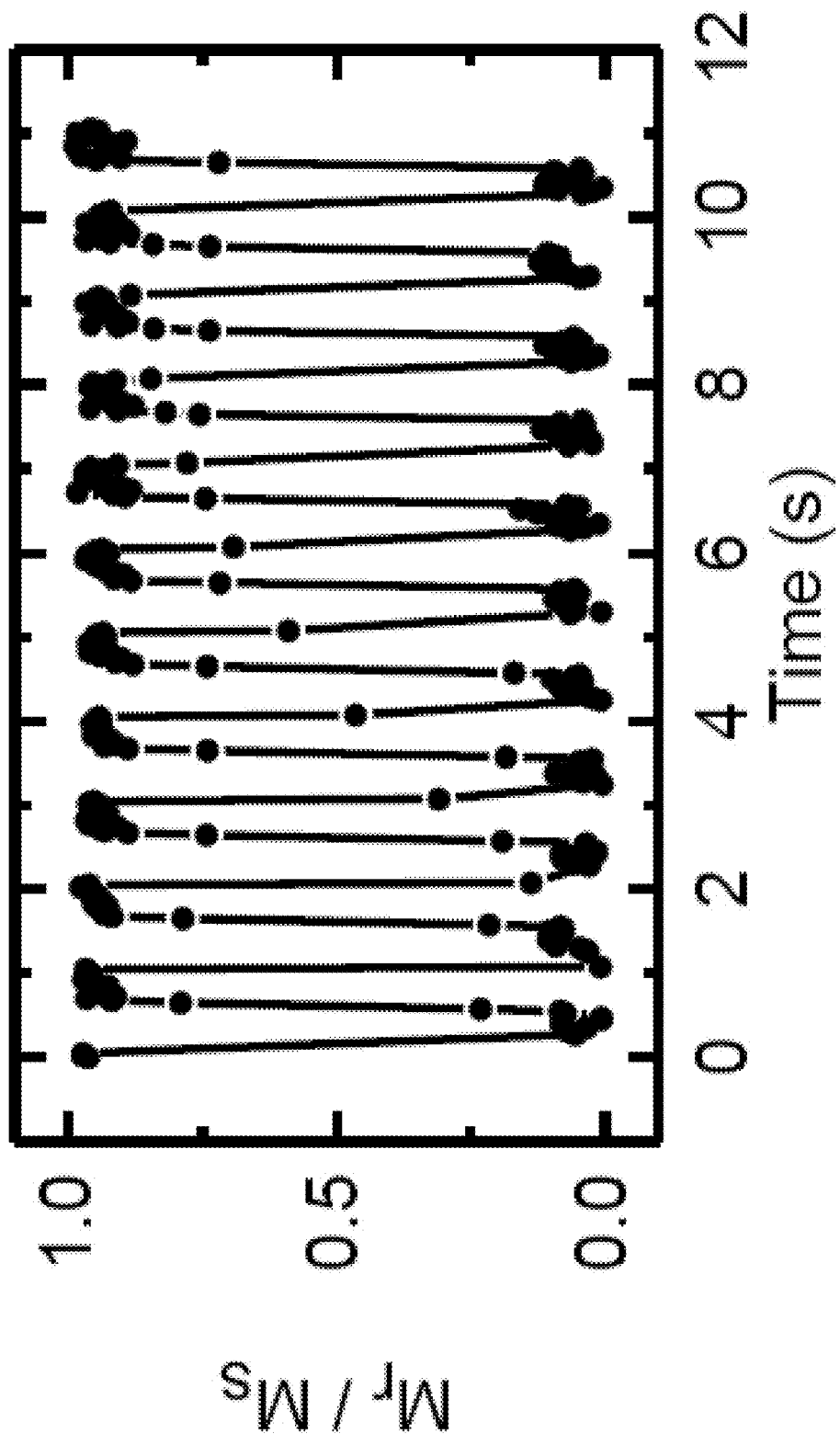
FIG. 11A shows the out-of-plane magnetization remanence ratio, $M_r/M_s$, of the magneto-ionic device of FIG. 9A and FIG. 9B during cyclability testing.
Figure 11C:
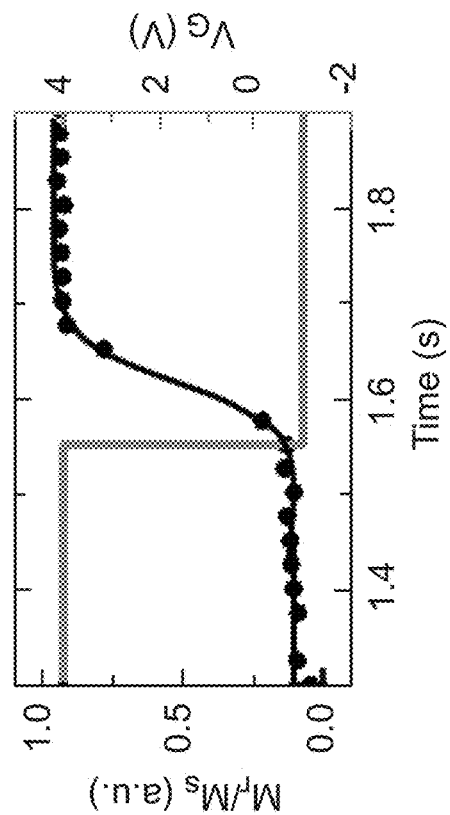
FIG. 11C shows the out-of-plane remanence magnetization ratio, $M_r/M_s$, as the gate voltage, $V_g$, falls in FIG. 11A.
Figure 11B:
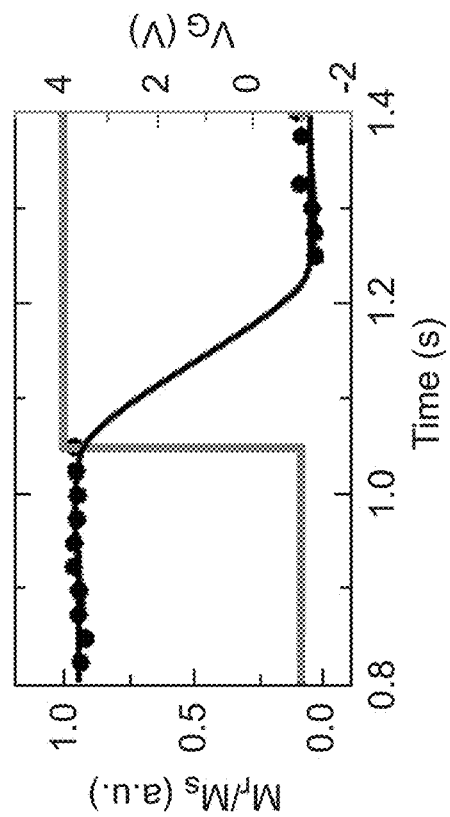
FIG. 11B shows the out-of-plane remanence magnetization ratio, $M_r/M_s$, as the gate voltage, $V_g$, rises in FIG. 11A.

Cyclability tests were also performed on the magneto-ionic device 3000. FIG. 11A shows the magnetization ratio, $M_r/M_s$, as the gate voltage is cycled between $V_g=+4V$ and $-1V$ at a frequency of 1 Hz. Each data point corresponds to a MOKE hysteresis loop as collected at intervals of 25 ms. As shown in FIGS. 11B and 11C, the switching times at the rising and falling $V_g$ edge are both about 150 ms, which indicates the use of a negative gate voltage does speed up the reverse reactions of Eqs. (3) and (4). These results indicate the magnetic anisotropy at a metal/metal interface can be modulated substantially by an electric field using electrochemical gating of a metal to its hydride phase in an appropriately designed solid state heterostructure.

For the magneto-ionic device 3000, the operable range of gating voltages depends on several contributions. First, the water-splitting potential is about 1.2V. Second, the hydrogen loading voltage in the hydrogen insertion layer 3050 is less than 0.1 V. Thus, the lower threshold for the positive gate voltage to induce a transition in the magneto-ionic device 3000 is about 1.3 V. However, the kinetic barriers in the magneto-ionic device 3000 typically decrease the switching speed of the magneto-ionic device 3000. This may be compensated by increasing the positive gating voltage, e.g., greater than about +2V. For the reverse reaction, the magneto-ionic device 3000 may be short-circuited with $V_g=0V$. However, the kinetics of the reaction may again decrease the switching speed; hence, a negative gate voltage, e.g., less than about −1V, may be used to accelerate the reaction.

An Exemplary Two-Terminal MRAM Device

Figure 12A:
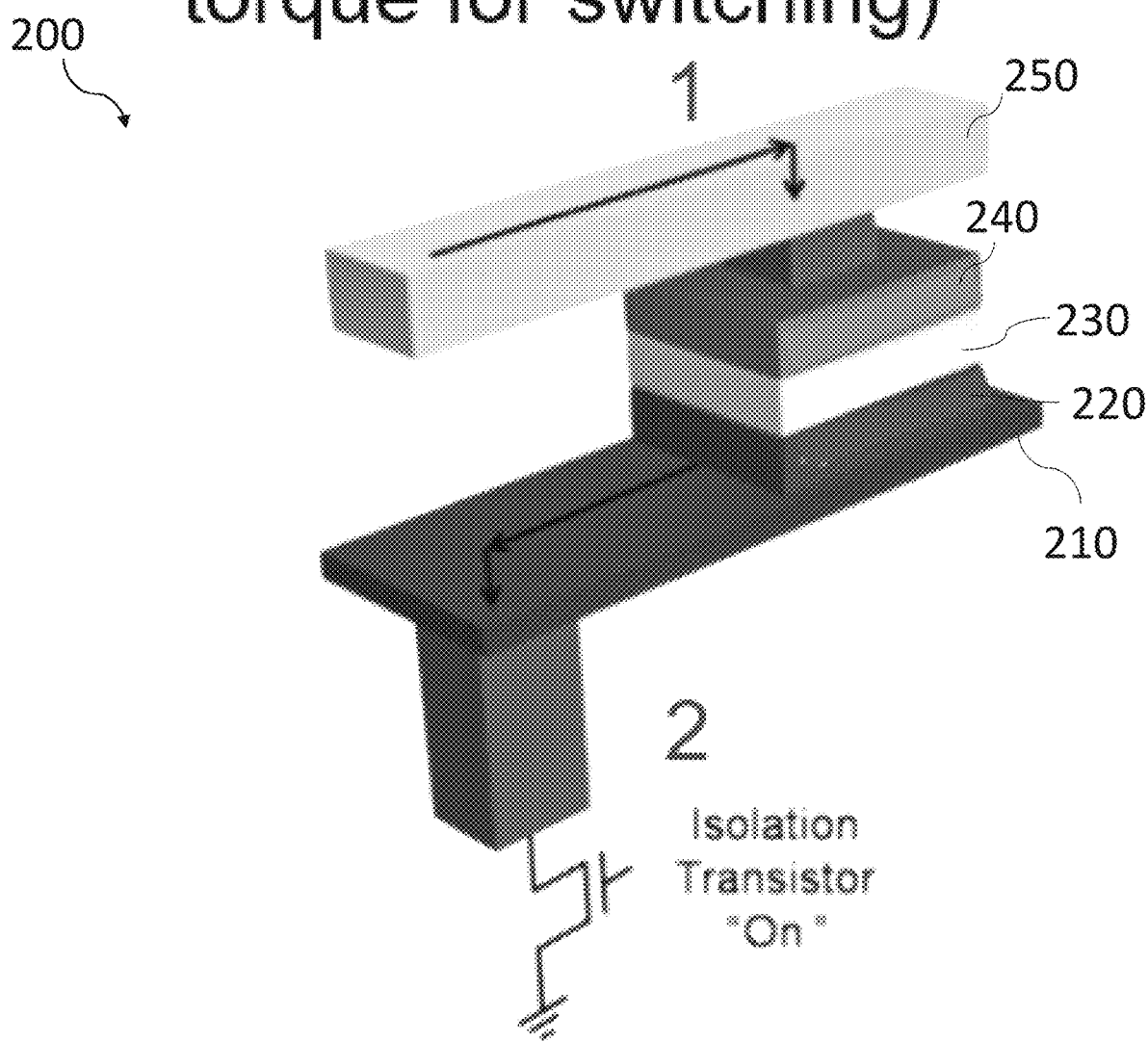
FIG. 12A shows an illustration of a conventional two-terminal magnetic random-access memory (MRAM) device.

The hydrogen-gated magneto-ionic mechanism disclosed herein may be applied to various applications. For example, the magneto-ionic device may be integrated into a two-terminal magnetic rapid access memory (MRAM) device. FIG. 12A shows a conventional two-terminal MRAM device 200 comprised of a free magnet 220, a tunnel barrier 230, a reference magnet 240 as well as a first electrode 210 and a second electrode 250. The magnetization of the reference magnet 240 is fixed whereas the magnetization of the free magnet 220 may be changed by an externally applied field. The tunnel barrier 230 is typically a thin insulating layer configured to allow electrons to tunnel between the free magnet 220 and the reference magnet 240.

The electrical resistance of the two-terminal MRAM device 200 is dictated by the tunnel magnetoresistance (TMR), which can vary in magnitude depending on the relative orientation of the magnetization in the free magnet 220 and the reference magnet 240. For example, the reference magnet 240 may have an in-plane magnetization. The free magnet 220 may also have an in-plane magnetization that is either parallel or antiparallel to the magnetization of the reference magnet 240. The TMR will thus vary depending on whether the free magnet 220 and the reference magnet 240 have a parallel or antiparallel alignment, thus forming a bit value (e.g., a '0' or a '1') that may be read by measuring the electrical resistance of the two-terminal MRAM device 200.

In the two-terminal MRAM device 200, the bit value may be written by applying a spin-transfer torque (STT). For STT, electric current passes through a magnet where the electrons become spin-polarized as the electrons flow through a first magnet (i.e., the reference magnet 240). The spin-polarized current then enters a second magnet (i.e., the free magnet 220) imparting momentum to switch the magnetization of the second magnet. MRAM devices can, in principle, provide non-volatile, high speed, high density memory with an unlimited endurance.

Figure 12B:
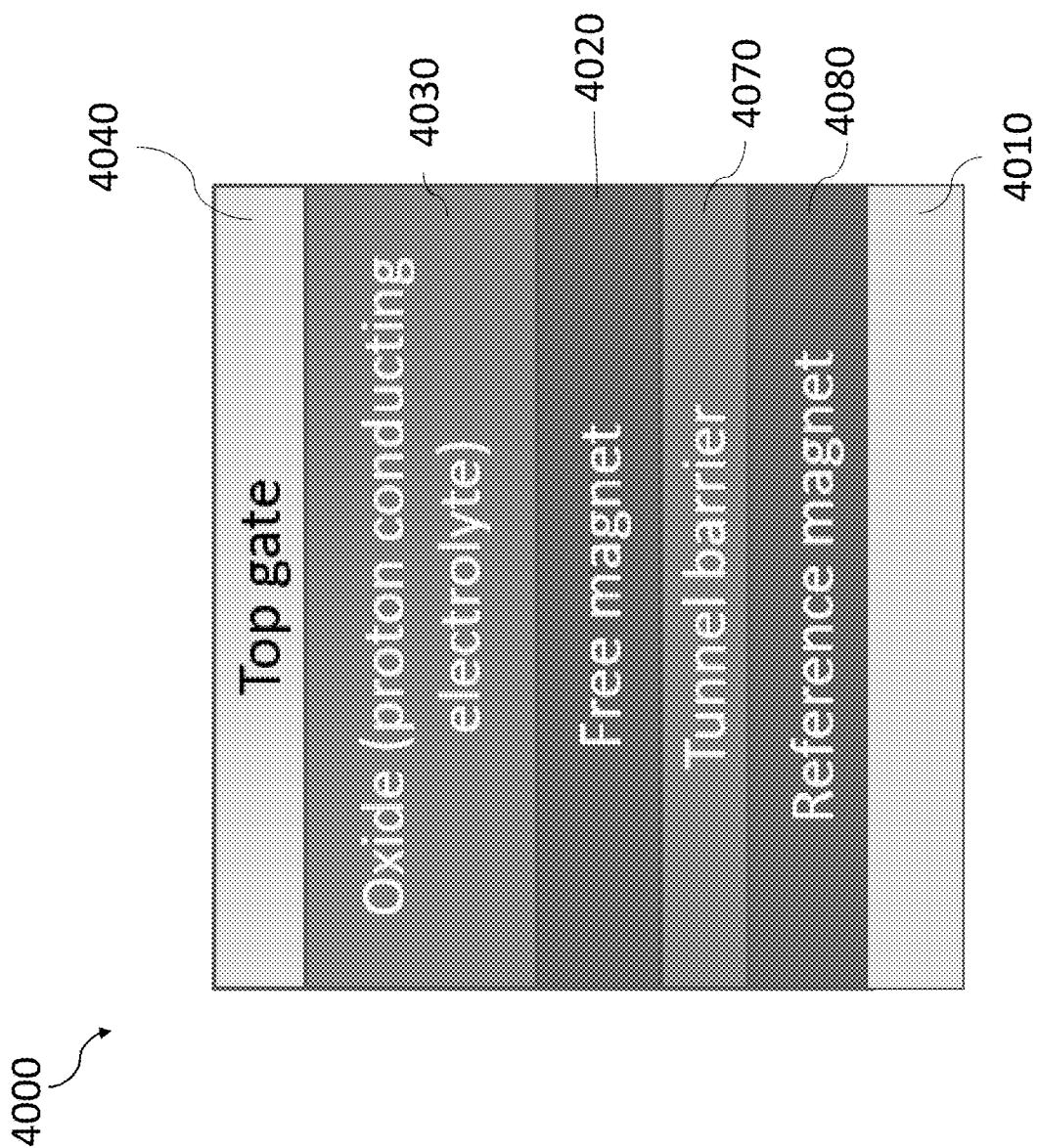
FIG. 12B shows an exemplary two-terminal MRAM device using the hydrogen-gated magneto-ionic mechanism.

The hydrogen-gated magneto-ionic mechanism may be incorporated into the two-terminal MRAM device 200 to reduce the energy barrier for switching. For example, FIG. 12B shows an exemplary two-terminal MRAM device 4000. The exemplary two-terminal MRAM device 4000 may be comprised of a first electrode 4010, a reference magnet 4080, a tunnel barrier 4070, a free magnet 4020, a proton conductor 4030, and a second electrode 4040.

The free magnet 4020 may initially have a first magnetic state corresponding to a large, positive magnetic anisotropy such that the magnetization points out-of-plane. When a positive gate voltage is applied to the two-terminal MRAM device 4000, hydrogen inserted at the interface between the free magnet 4020 and the proton conductor 4030 can cause the free magnet 4020 to transition from the first magnetic state to a second magnetic state corresponding to a small, positive magnetic anisotropy. The reduction in magnetic anisotropy corresponds to a reduction in the energy barrier for switching. This reduction occurs simultaneously with the injection of a spin-polarized current. Thus, when the magnetic anisotropy is reduced, the spin-polarized current can cause the free magnet 4020 to switch to a third magnetic state, which may be retained when the applied gate voltage is turned off. The third magnetic state may correspond to a large, positive magnetic anisotropy with a magnetization that points opposite to the first magnetic state.

Figure 12C:
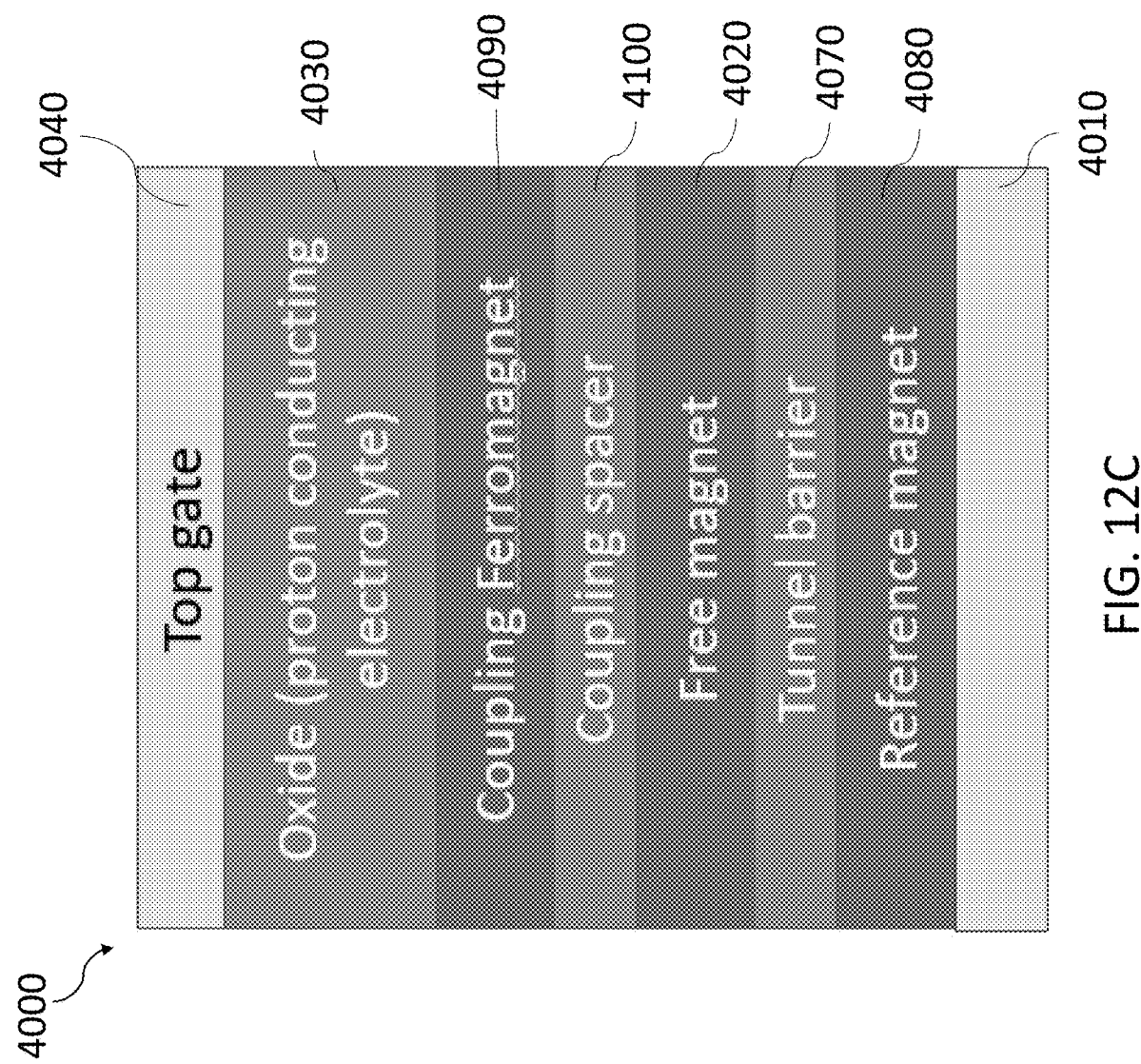
FIG. 12C shows another exemplary two-terminal MRAM device using the hydrogen-gated magneto-ionic mechanism.

The two-terminal MRAM device 4000 may, in some instances, include a hydrogen insertion layer between the free magnet 4020 and the proton conductor 4030 to enable use of a negative gate voltage without causing oxidation of the free magnet 4020. The two-terminal MRAM device 4000 may also include a hydrogen storage layer, preferably disposed between the proton conductor 4030 and the second electrode 4040 to form a closed system. FIG. 12C shows the two-terminal MRAM device 4000 may further include a coupling ferromagnet 4090 between the proton conductor 4030 and the free magnet 4020 and a coupling spacer 4100 between the coupling ferromagnet 4090 and the free magnet 4020. The coupling ferromagnet 4090 and the coupling spacer 4100 may be directed gated instead of the free magnet 4020, thus protecting the free magnet 4020 from structural degradation.

Generally, an array of two-terminal MRAM devices 4000 may be assembled to form a memory device. For example, a cross point architecture may be used where the first electrode 4010 and the second electrode 4040 of multiple two-terminal MRAM device 4000 are connected to one or more word lines and one or more bit lines, respectively. In this manner, an array of memory cells may be formed that can each be individually read and written.

An Exemplary Three-Terminal MRAM Device

Figure 13A:
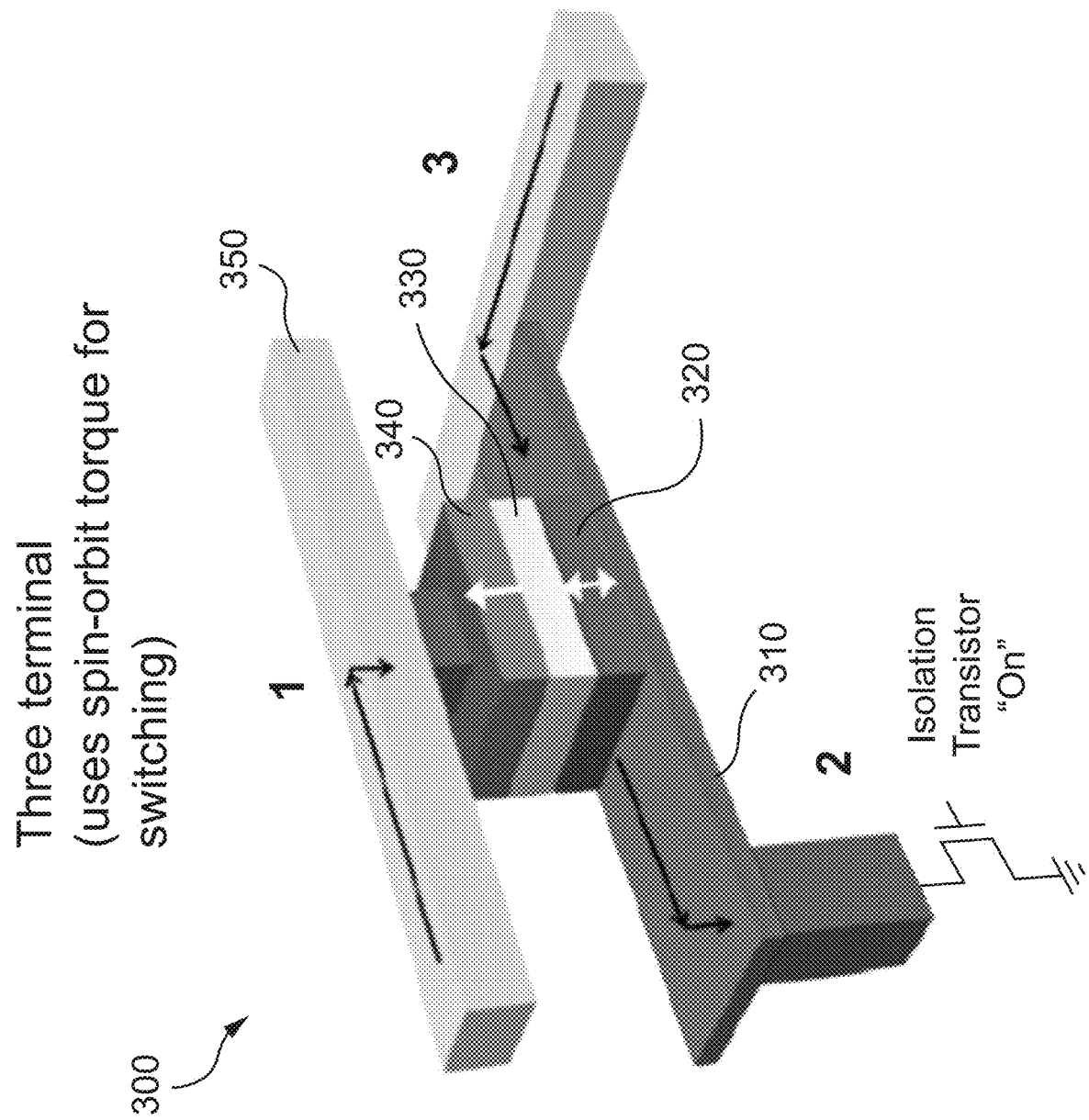
FIG. 13A shows an illustration of a conventional three-terminal MRAM device.

The magneto-ionic device may also be integrated into a three-terminal MRAM device 300 as illustrated in FIG. 13A. The three-terminal MRAM device 300 may operate in a similar manner to the two-terminal MRAM device 300 in that the bit value of the three-terminal MRAM device 300 is determined by the relative orientation of the magnetization of a free magnet 320 and a reference magnet 340 separated by a tunnel barrier 330. The difference between three-terminal MRAM device 300 and the two-terminal MRAM device 300, however, lies in the writing mechanism. In the three-terminal MRAM device 300, a spin-orbit torque (SOT) may be used to write the bit value.

For SOT, a spin Hall layer 310 is coupled to the three-terminal MRAM device 300. The large spin Hall angle layer 310 is coupled to two electrodes and thus supports an electric current that flows electrons adjacent to the free magnet 320. When electrons flow through the heavy metal layer 310, electrons with one spin curls to one side of the spin Hall layer 310 while electrons with the opposite spin curs to the opposite side of the spin Hall layer 310. The electrons that curl towards the free magnet 320 can flow into the free magnet 320, thereby imparting momentum to switch the magnetic states of the free magnet 320.

Figure 13B:
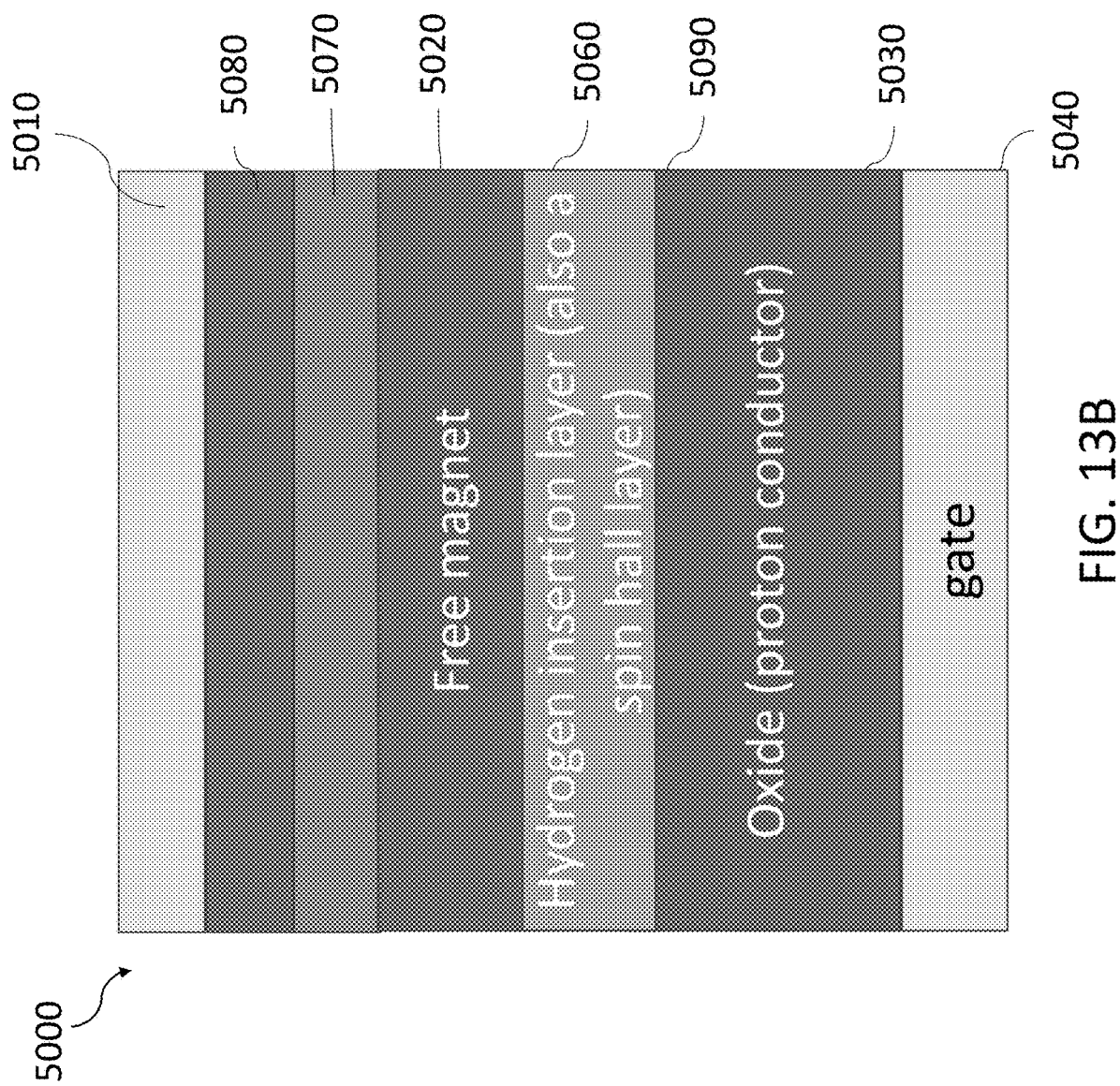
FIG. 13B shows an exemplary three-terminal MRAM device using a hydrogen-gated magneto-ionic mechanism.

An exemplary three-terminal MRAM device 5000 incorporating the hydrogen-gated magneto-ionic mechanism is shown in FIG. 13B. As shown, the three-terminal MRAM device 5000 may include a first electrode 5010, a reference magnet 5080, a tunnel barrier 5070, a free magnet 5020, a spin hall layer 5060, a coupling ferromagnet 5090, a proton conductor 5030, and a second electrode 5040. The spin hall layer 5060 may be coupled to two terminals to support an electric current that flows in-plane with the spin hall layer 5060. During writing, a gate voltage may be applied to the first electrode 5010 and the second electrode 5040 to reduce the energy barrier for switching in the free magnet 5020. Once the energy barrier is reduced, an electric current may then be passed along the heavy metal layer 5060 to switch the free magnet 5020. Compared to the two-terminal MRAM device 5000, the three-terminal MRAM device 5000 provides separate control over the reduction of the energy barrier and the injection of a spin-polarized current.

Figure 13C:
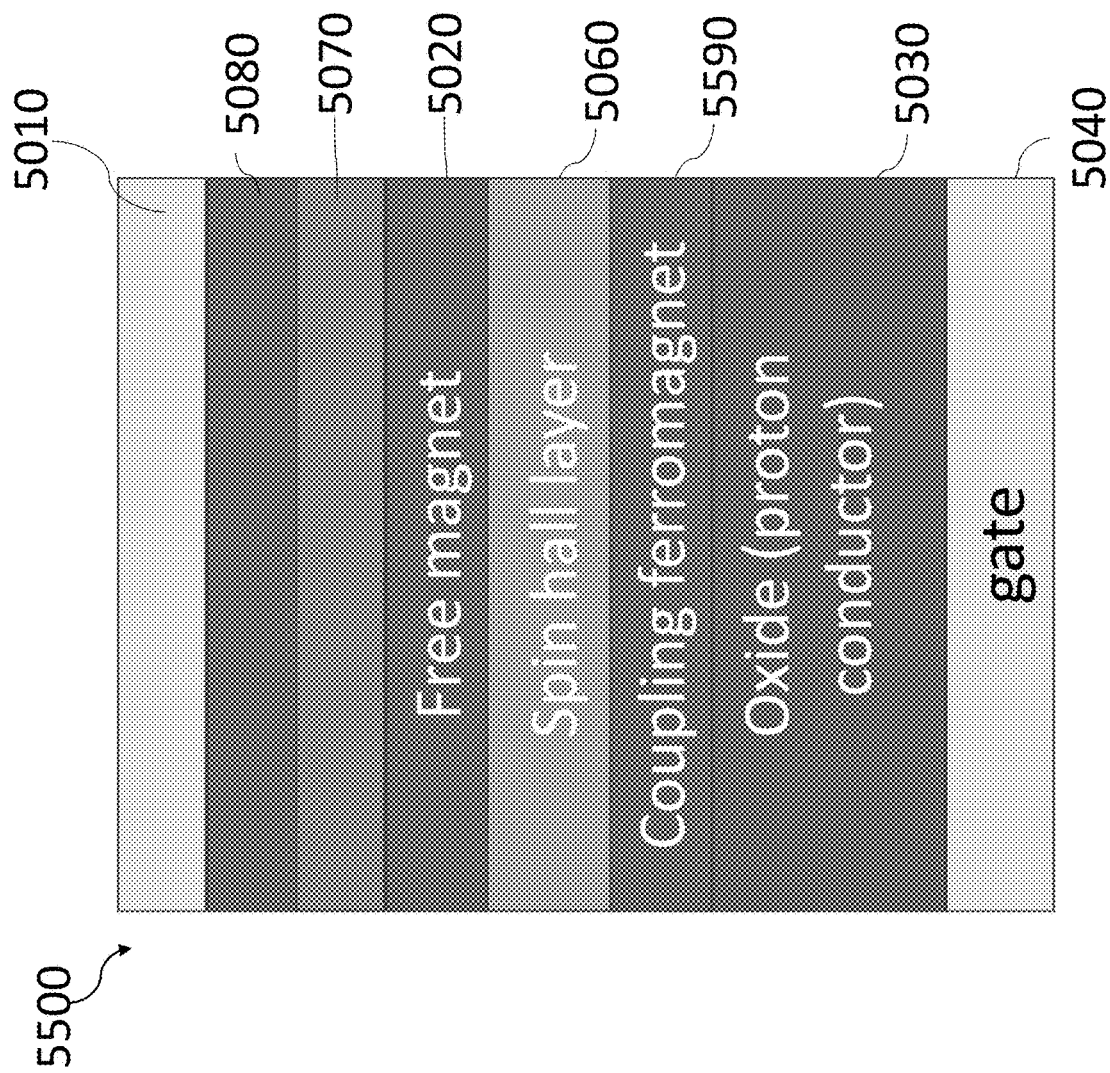
FIG. 13C shows an exemplary three-terminal MRAM device with a gated coupling ferromagnet.

FIG. 13C shows another three-terminal MRAM device 5500. This device 5500 has a coupling ferromagnet 5590 which can be gated as well. This coupling ferromagnet 5590 couples to the free magnet 5020, which in turn changes its switching barrier.

Figure 13D:
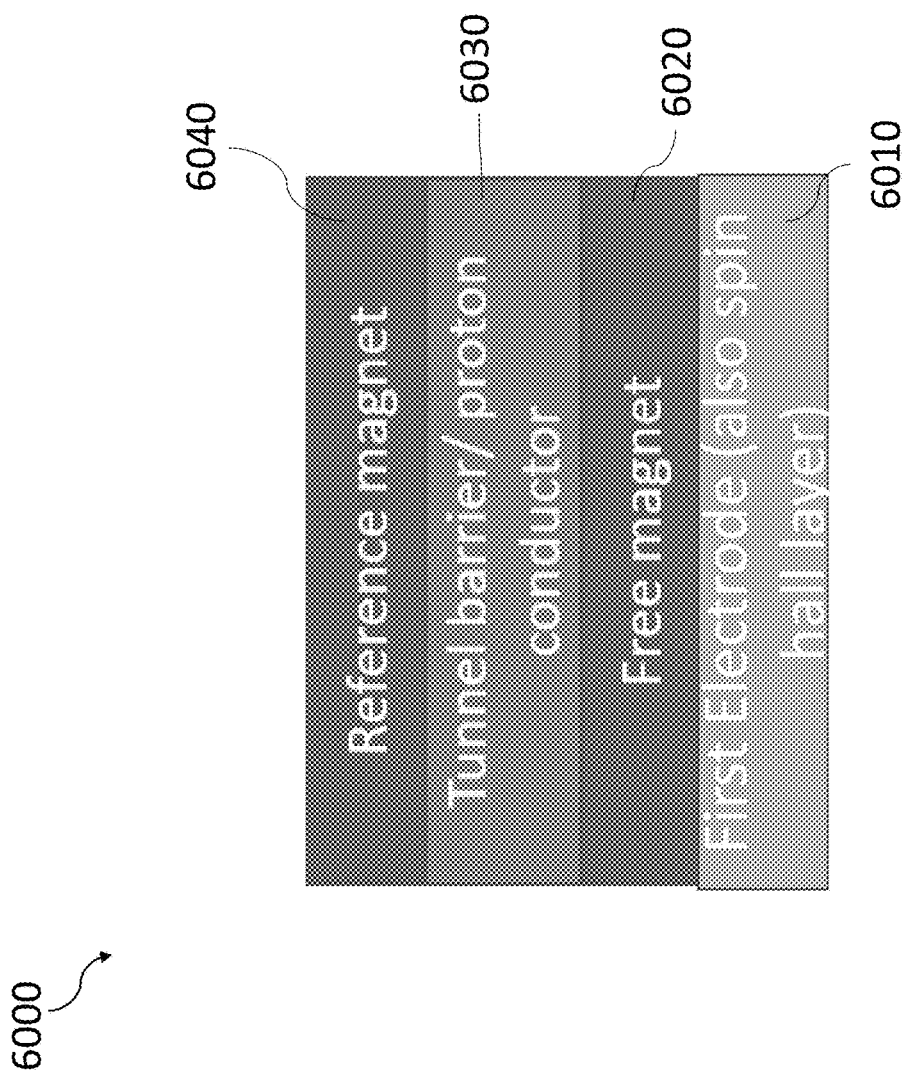
FIG. 13D shows another exemplary three-terminal MRAM device using the hydrogen-gated magneto-ionic mechanism.

FIG. 13D shows another exemplary three-terminal MRAM device 6000. In this case, the three-terminal MRAM device 6000 is comprised of a first electrode 6010 that functions as the spin Hall layer, a free magnet 6020, a proton conductor 6030 that functions as the tunnel barrier, and a second electrode 6040 that functions as the reference magnet. Thus, a gate voltage may again be applied to the first electrode 6010 and the second electrode 6040 to reduce the energy barrier for switching of the free magnet 6020. Once the energy barrier is reduced, an electric current may be passed along the first electrode 6010 to switch the free magnet 6020.

To summarize, in FIG. 13B, the gating the hydrogen insertion (spin Hall) layer 5060 adjacent to the free magnet 5020 changes the free magnet's properties; in FIG. 13C, gating a coupling ferromagnet 5590 changes the free magnet's properties; and in FIG. 13D, gating the free magnet 5020 directly changes its properties.

Similar to the two-terminal MRAM device 4000, an array of three-terminal MRAM devices may be assembled to form a memory device. The respective terminals of the three-terminal MRAM devices may again be connected to the corresponding terminals of other three-terminal MRAM devices such that each three-terminal MRAM device may be individually addressed in the memory device.

An Exemplary Spin Texture and Spin Wave Device

In other applications, the hydrogen-gated magneto-ionic mechanism may be used to manipulate the propagation of spin textures (e.g., skyrmions, magnetic domains) and magnetic waves (e.g., magnons). For example, skyrmions are magnetic quasiparticles formed by individual electron spins, which may be generated and transported using an electric current. In racetrack memory devices, skyrmions may travel along a strip of magnetic material referred to as the racetrack when an electric current is applied along the racetrack. The presence or absence of the skyrmions along the racetrack form a series of bit values, which may be read or written by electrical devices coupled to the racetrack.

The transport of skyrmions along the racetrack may be affected, in part, by the magnetic anisotropy and exchange interactions like Dzyaloshinskii-Moriya Interaction (DMI) of the racetrack, which may be modified by the hydrogen-gated magneto-ionic mechanism. In particular, spatial variations in magnetic anisotropy along the racetrack (e.g., different portions of the racetrack have different magnetic anisotropies) can affect the motion of skyrmions. For example, a large magnetic anisotropy can allow passage of skyrmions across a portion of the racetrack while a small magnetic anisotropy can block skyrmions across another portion of the racetrack. In another example, the magnetic anisotropy may be adjusted between multiple racetracks such that the skyrmions are temporally synchronized (i.e., clock synchronization). In another example, the magnetic anisotropy along the racetrack may be tuned to substantially reduce a transverse velocity component of skyrmions, enabling skyrmions to travel substantially straight along the racetrack. In another example, the magnetic anisotropy maybe spatially varied across a magnetic film to move skyrmions in along a two-dimensional or three-dimensional trajectory in a deterministic manner. In another example, the magnetic anisotropy may be tuned to pin domain walls from propagating along the racetrack.

The propagation of magnetic waves, such as magnons, may also be controlled, in part, by spatially varying the magnetic anisotropy, magnetic damping, and exchange interactions like DMI along a waveguide. Magnons arise from the motion of adjacent magnetic moments, which may be slightly out of phase from one another. Magnons are wave phenomena and thus may be characterized by a wavelength, a phase, and a group velocity that depends on various magnetic properties including, but not limited to, damping, demagnetizing fields, and other magnetic interactions. In some instances, an electric current may be used to modify the wavelength of the magnons (e.g., positive current increases the wavelength and negative current decreases the wavelength). An electric field may also be used to modify the population of magnons in a magnetic material.

Figure 14:
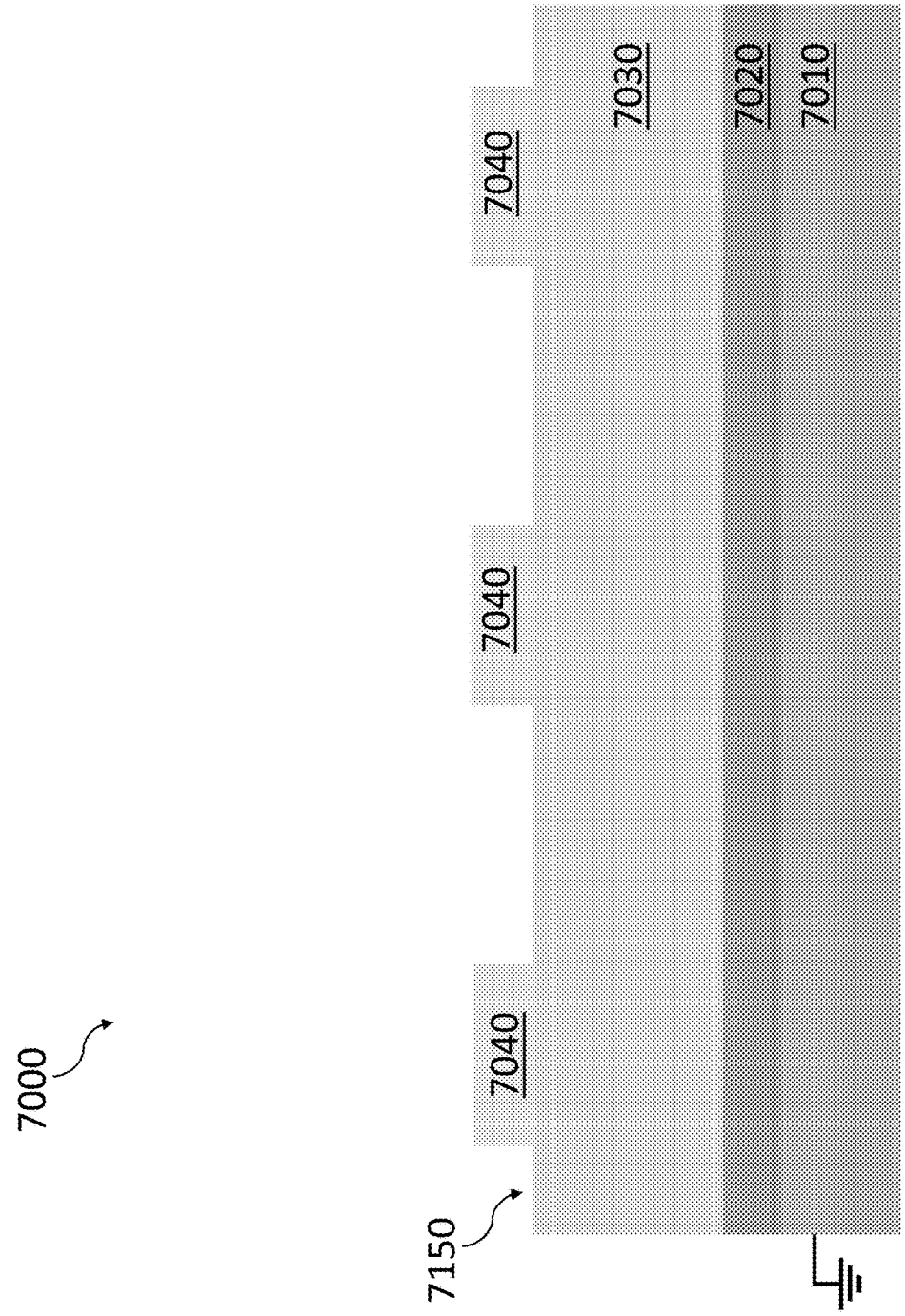
FIG. 14 shows an exemplary magneto-ionic device used for spin texture and spin wave applications.

For both these applications, the device may include a magnetic strip of material configured to enable the transport of magnetic particles or waves. As shown in FIG. 14, the magnetic strip 7150 may be comprised of a first electrode 7010, a magnetic layer 7020, and a proton conductor 7030. Multiple second electrodes 7040 may be disposed across the magnetic strip 7150 where each second electrode 7040 is able to gate a portion of the magnetic layer 7020 proximate to each second electrode 7040. In this manner, the magnetic properties of the magnetic layer 7020 may be varied spatially by applying a gate voltage to one or more of the second electrodes 7040. In this manner, the transport of magnetic particles and/or magnetic waves may be controlled by a gating voltage applied to one or more of the second electrodes 7040 disposed along the magnetic strip 7020. FIG. 14 can also be thought of as showing a cross section of a magnetic film where multiple second electrodes are disposed across the magnetic film 7150 where each second electrode 7040 is able to gate magnetic properties of the magnet layer 7020 across different regions of the magnetic film.

An Exemplary Complementary Logic Device

Figure 15:
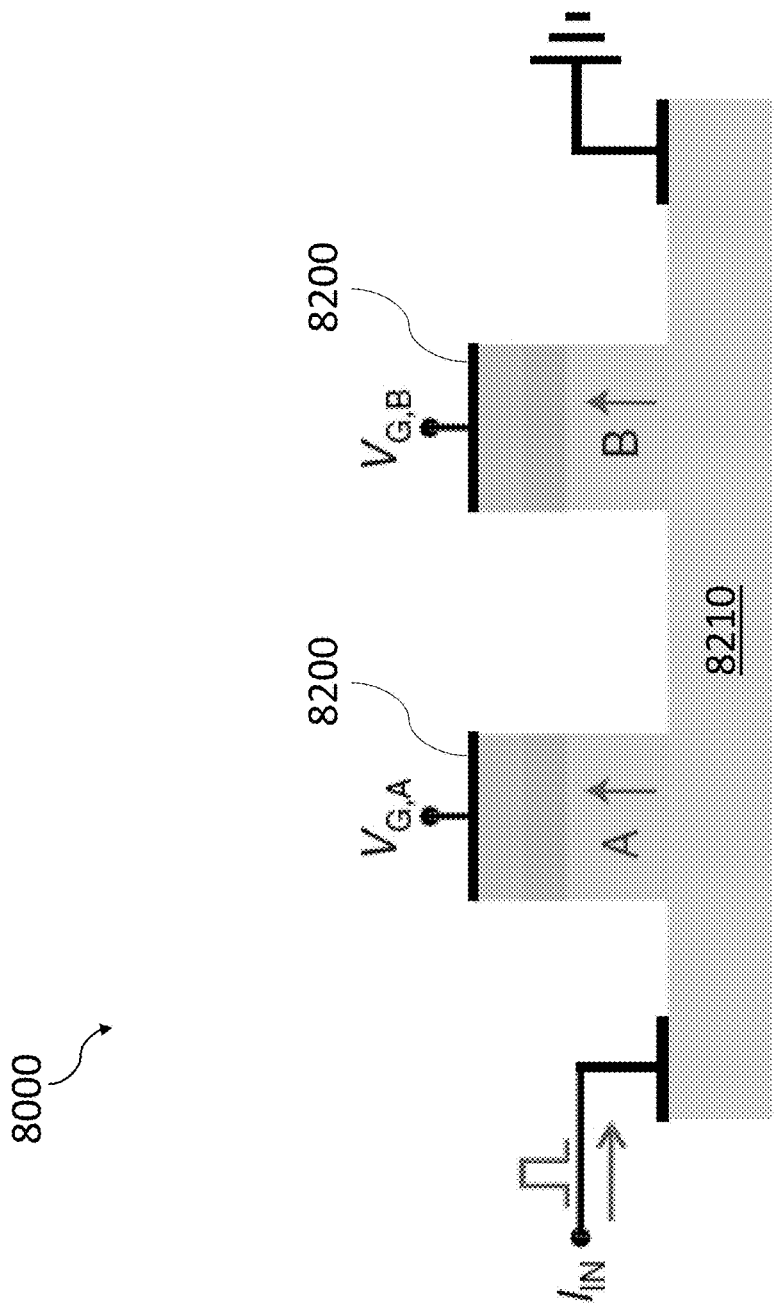
FIG. 15 shows an exemplary complementary logic device using the hydrogen-gated magneto-ionic mechanism.

In another example, FIG. 15 shows a complementary logic device 8000 comprised of one or more cells 8200 that each have a binary bit value of 1 or 0 and are connected to a common electrical bus 8210. A gate voltage may be applied to each cell 8200 in order to control whether each cell 8200 can be switched by an input current applied to the common electrical bus 8210. The cell 8200 may be configured such that an out-of-plane magnetization pointed away from the electrical bus results in a large Hall resistance. Conversely, the cell may also have an out-of-plane magnetization pointed towards the electrical bus resulting in a small Hall resistance. The readout from the complementary logic device 8000 can be a summation of the resistances from each cell 8200 connected by the common electrical bus 8210. By using a periodic input current synced to a clock, the complementary logic device 8000 may be used as a logic gate with the gating voltage applied to each cell 8200 as an input.

An Exemplary Neuromorphic Device

The hydrogen-gated magneto-ionic mechanism may also be used for neuromorphic computing. In neuromorphic computing, a device may be trained to associate different inputs to a common output. For example, a dog may salivate to the sight of food. If a sound is paired with the sight of food, the dog may eventually learn to salivate in response to the sound. For a neuromorphic computer, the 'sight of food' and the 'sound' are each inputs and 'salivation' is an output. When both inputs are supplied together, an internal property of the neuromorphic computer may be changed such that when either input, e.g., the 'sight of food' or the 'sound,' is supplied to the neuromorphic computer, the output is 'salivation.'

As described above, the magneto-ionic devices can exhibit a voltage threshold, which when exceeded, can cause a magnetic property of the magnetic layer to change, e.g., a transition from an out-of-plane magnetization to an in-plane magnetization. Thus, magneto-ionic devices may be used in neuromorphic computing where the inputs may be gate voltages and the output may be an electrical resistance (e.g., RHE resistance, AHE resistance). Additionally, switching speed of the magneto-ionic device can be tuned based on the magnitude and sign of the applied gating voltage. This degree of freedom may be used to tune the speed at which the magneto-ionic device may "forget" or "learn" to associate particular inputs to a desired output.

Figure 16:
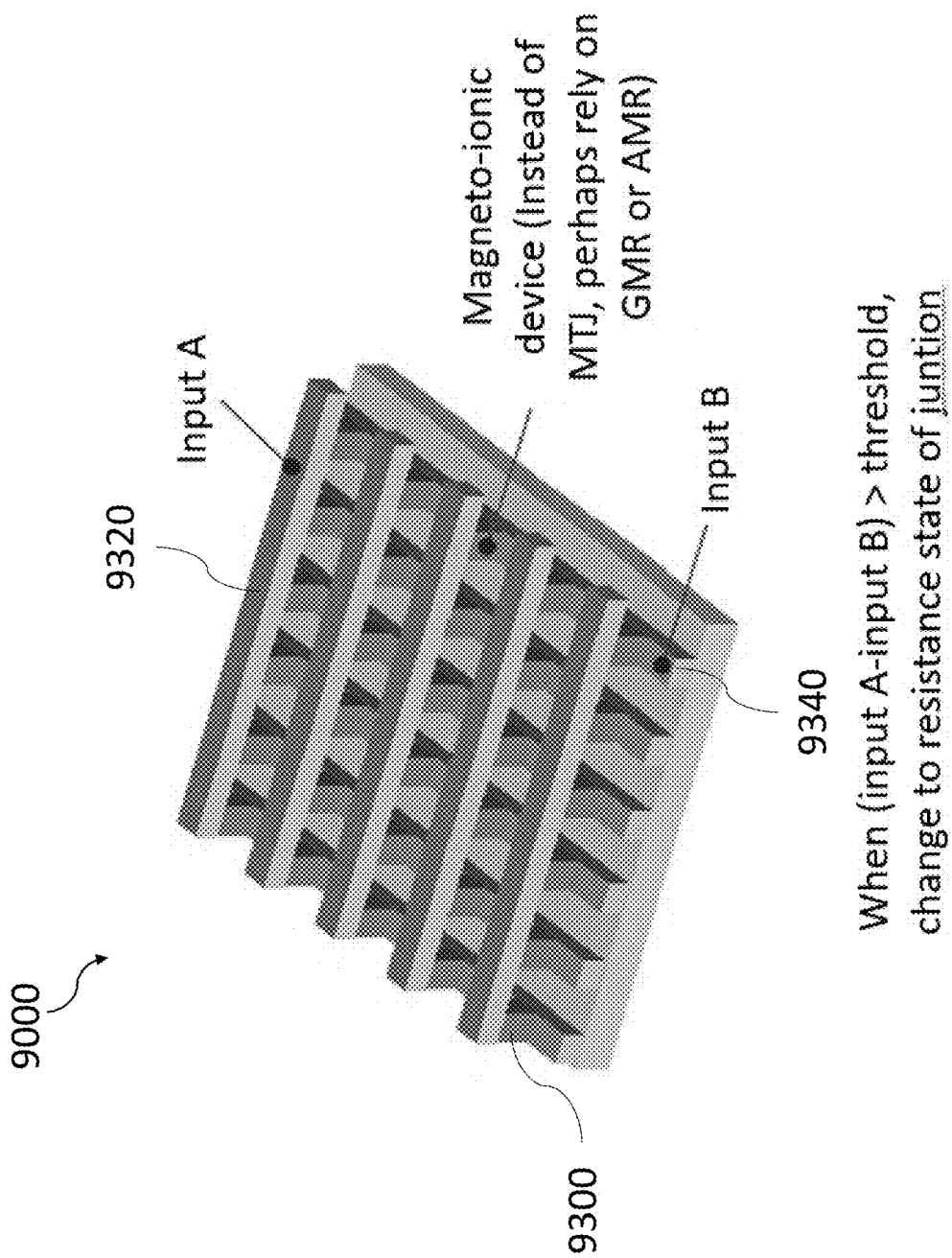
FIG. 16 shows an exemplary neuromorphic computer using the hydrogen-gated magneto-ionic mechanism.

FIG. 16 shows an exemplary implementation of an array of magneto-ionic devices 9300 to form a neuromorphic computer 9000. Each one of the magneto-ionic devices 9300 may be configured to operate as a magnetic tunnel junction or may rely on other magnetic properties such as giant magnetoresistance or anisotropic magnetoresistance. As shown, the array of magneto-ionic devices 9300 may be arranged using a crossbar structure where the first electrodes of the array of magneto-ionic devices 9300 are connected to a first bus 9320 and the second electrodes of the array of magneto-ionic devices 9300 are connected to a second bus 9340. In this manner, each magneto-ionic device 9300 may be individually addressed by the first bus 9320 and the second bus 9340.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A magneto-ionic device, comprising:
   a first electrode;
   a second electrode;
   a magnetic layer disposed between the first electrode and the second electrode; and
   a proton conductor disposed between the magnetic layer and the second electrode,
   wherein a first gate voltage applied to the first electrode and the second electrode transports protons from the second electrode through the proton conductor toward the magnetic layer where a first portion of the protons are reduced to hydrogen, the hydrogen and a second portion of the protons causing the magnetic layer to switch from a first magnetic state to a second magnetic state.

2. The magneto-ionic device of claim 1, wherein the first magnetic state has a magnetic anisotropy greater than zero and the second magnetic state has a magnetic anisotropy less than zero.

3. The magneto-ionic device of claim 1, wherein the first magnetic state has a magnetic anisotropy greater than $10^6$ erg/cc and the second magnetic state has magnetic anisotropy of at least 10% less the first magnetic anisotropy.

4. The magneto-ionic device of claim 3, wherein the first magnetic state and the second magnetic state each correspond to an out-of-plane magnetization relative to a plane of the magnetic layer, the plane of the magnetic layer being parallel to the first electrode and the second electrode.

5. The magneto-ionic device of claim 1, wherein the proton conductor has a proton conductivity ranging between about $10^{-10}$ S/cm and about $10^{-1}$ S/cm and an electrical conductivity of less than about $10^{-10}$ S/cm.

6. The magneto-ionic device of claim 1, wherein the proton conductor is formed from at least one of gadolinium oxide, terbium oxide, cerium oxide, barium cerium oxide, barium zirconium oxide, yttrium stabilized zirconia, or gadolinium-doped ceria.

7. The magneto-ionic device of claim 1, wherein the proton conductor is formed from an oxide, the oxide forming an oxygen bond between the proton conductor and the magnetic layer that causes the magnetic layer to have an out-of-plane magnetization relative to a plane of the magnetic layer, the plane of the magnetic layer being parallel to the first electrode and the second electrode.

8. The magneto-ionic device of claim 1, further comprising:
a hydrogen source to provide water molecules,
wherein the second electrode catalyzes a water-splitting reaction that splits the water molecules into the protons and oxygen at the interface between the second electrode and the proton conductor.

9. The magneto-ionic device of claim 8, wherein the hydrogen source comprises a hydrogen storage layer disposed between the proton conductor and the second electrode.

10. The magneto-ionic device of claim 1, further comprising:
a hydrogen insertion layer, disposed between the magnetic layer and the proton conductor, to store the hydrogen when the first gate voltage is applied to the first electrode and the second electrode and to release the hydrogen when a second gate voltage is applied to the first electrode and the second electrode.

11. The magneto-ionic device of claim 10, wherein the magnetic layer transitions from the first magnetic state to the second magnetic state when hydrogen is stored in the hydrogen insertion layer and the magnetic layer transitions from the second magnetic state to the first magnetic state when hydrogen is released from the hydrogen insertion layer.

12. The magneto-ionic device of claim 11, wherein the first gate voltage is at least about +1.3 V and the second gate voltage less than about 0 V.

13. The magneto-ionic device of claim 10, wherein the hydrogen insertion layer has a thickness of about 3 nm to about 100 nm.

14. The magneto-ionic device of claim 10, wherein the magnetic layer switches between the first magnetic state and the second magnetic state in less than about 1 second.

15. The magneto-ionic device of claim 10, wherein the hydrogen insertion layer has a first current-induced spin-orbit torque when hydrogen is stored in the hydrogen insertion layer and a second current-induced spin-orbit torque when hydrogen is released from the hydrogen insertion layer.

16. The magneto-ionic device of claim 1, further comprising:
a third electrode coplanar with and electrically isolated from the second electrode.

17. The magneto-ionic device of claim 1, wherein the magnetic layer is a first magnetic layer, and further comprising:
a second magnetic layer disposed between the first electrode and the first magnetic layer; and
a tunnel barrier, disposed between the first magnetic layer and the second magnetic layer, to tunnel electrons between the first magnetic layer and the second magnetic layer.

18. The magneto-ionic device of claim 17, the second magnetic layer remains in a third magnetization state while the first magnetic layer switches from the first magnetic state to the second magnetic state.

19. The magneto-ionic device of claim 18, wherein the first magnetic layer is configured to transition from the second magnetic state to the third magnetic state in response to injection of a spin-polarized current into the first magnetic layer.

20. The magneto-ionic device of claim 1, wherein the magnetic layer is a first magnetic layer, and further comprising:
a second magnetic layer, disposed between the first magnetic layer and the proton conductor, to reduce degradation of the first magnetic layer; and
a coupling spacer disposed between the first magnetic layer and the second magnetic layer.

21. A method of reversibly switching a magnetic state of a magneto-ionic device comprising a first electrode, a second electrode, a proton conductor between the first electrode and the second electrode, and a magnetic layer between the proton conductor and the second electrode, the method comprising:
applying a first gate voltage to the first electrode and the second electrode from a voltage source, the first gate voltage transporting protons through the proton conductor from the second electrode toward the magnetic layer to reduce a first portion of the protons to hydrogen, the hydrogen and a second portion of the protons causing the magnetic layer to switch from a first magnetic state to a second magnetic state.

22. The method of claim 21, further comprising:
catalyzing, by the second electrode, a water-splitting reaction that splits water molecules into the protons and oxygen ions at an interface between the second electrode and the proton conductor.

23. The method of claim 21, further comprising:
disconnecting the voltage source from the magneto-ionic device such that the magneto-ionic device operates at open circuit and remains in the second magnetic state.

24. The method of claim 23, further comprising:
short-circuiting the magneto-ionic device, the short circuit causing the second portion of the protons to move from the magnetic layer toward the second electrode, thereby causing the magnetic layer to switch from the second magnetic state to the first magnetic state.

25. The method of claim 24, wherein the magneto-ionic device further comprises a hydrogen insertion layer disposed between the proton conductor and the magnetic layer and further comprising at least one of:
storing the hydrogen in the hydrogen insertion layer when the magnetic layer transitions from the first magnetic state to the second magnetic state; or
releasing the hydrogen from the hydrogen insertion layer when the magnetic layer transitions from the second magnetic state to the first magnetic state.

26. The method of claim 21, further comprising:
applying a second gate voltage to the first electrode and the second electrode, the second gate voltage having a polarity opposite to a polarity of the first gate voltage and causing the second portion of the protons to move away from the magnetic layer, thereby switching the magnetic layer from the second magnetic state to the first magnetic state.

27. The method of claim 21, wherein the first magnetic state has a magnetic anisotropy greater than zero and corresponding to an out-of-plane magnetization relative to the plane of the magnetic layer, the plane of the magnetic layer being parallel to the first electrode and the second electrode and further comprising:
injecting a spin-polarized current into the magnetic layer to cause the magnetic layer to transition from the second magnetic state to a third magnetic state, the third magnetic state having a magnetic anisotropy greater than zero and corresponding to a magnetization oriented opposite to the first magnetic state; and removing the first gate voltage so as to keep the magnetic layer in the third magnetic state.

28. A device comprising:

a first electrode;

a second electrode to catalyze a water-splitting reaction that splits water molecules into protons and oxygen;

a magnetic layer disposed between the first electrode and the second electrode; and a proton conductor, disposed between the magnetic layer and the second electrode, to transport the protons from the second electrode toward the magnetic layer, the protons causing the magnetic layer to switch from a first magnetic state to a second magnetic state.

* * * * *